(12) United States Patent
Hu et al.

(10) Patent No.: US 11,422,458 B2
(45) Date of Patent: Aug. 23, 2022

(54) NANO-STAMPING TO CREATE TWO DIFFERENT GRATINGS TO MODULATE LIGHT IN AMPLITUDE AND PHASE VIA LIQUID CRYSTALS

(71) Applicants: Darwin Hu, San Jose, CA (US); Cheng Hsing Liao, Zhubei (TW)

(72) Inventors: Darwin Hu, San Jose, CA (US); Cheng Hsing Liao, Zhubei (TW)

( * ) Notice: Subject to any disclaimer, the term of this patent is extended or adjusted under 35 U.S.C. 154(b) by 396 days.

(21) Appl. No.: 16/389,911

(22) Filed: Apr. 19, 2019

(65) Prior Publication Data

US 2020/0333703 A1    Oct. 22, 2020

(51) Int. Cl.
```
G03F 7/00      (2006.01)
G03H 1/22      (2006.01)
G02F 1/1337    (2006.01)
G02F 1/1362    (2006.01)
```

(52) U.S. Cl.
CPC .......... *G03F 7/0002* (2013.01); *G02F 1/1337* (2013.01); *G02F 1/133753* (2013.01); *G02F 1/133757* (2021.01); *G02F 1/133776* (2021.01); *G03F 7/001* (2013.01); *G03H 1/2294* (2013.01); *G02F 1/136277* (2013.01); *G02F 2201/30* (2013.01); *G03H 2225/34* (2013.01)

(58) Field of Classification Search
CPC ......... G02F 1/133757; G02F 1/133776; G02F 1/1337; G02F 1/133753; G02F 1/136277; G02F 2201/30; G03F 7/002; G03F 7/001; G03H 1/2294; G02H 2225/34
USPC .......................................................... 349/25
See application file for complete search history.

(56) References Cited

U.S. PATENT DOCUMENTS 6,351,327 B1 *  2/2002  Walsh .................. G09G 3/3655
                                                      345/87
10,942,398 B1 *  3/2021  Calafiore ................ G02F 1/313

\* cited by examiner

*Primary Examiner* — Nathanael R Briggs
*Assistant Examiner* — William D Peterson
(74) *Attorney, Agent, or Firm* — Joe Zheng

(57) ABSTRACT

Architecture and designs of modulating both amplitude and phase at the same time in spatial light modulation are described. According to one aspect of the present invention, nano-imprinting lithograph (NIL) and E-beam are used to create micro structures (transparent) as alignment cells. A first group of the alignment cells are oriented in a first direction and a second group of the alignment cells are oriented in a second direction, light going through the first group of the alignment cells is modulated in amplitude thereof and the light going through the second group of the alignment cells is modulated in phase thereof, all via the liquid crystals and at the same time.

12 Claims, 39 Drawing Sheets

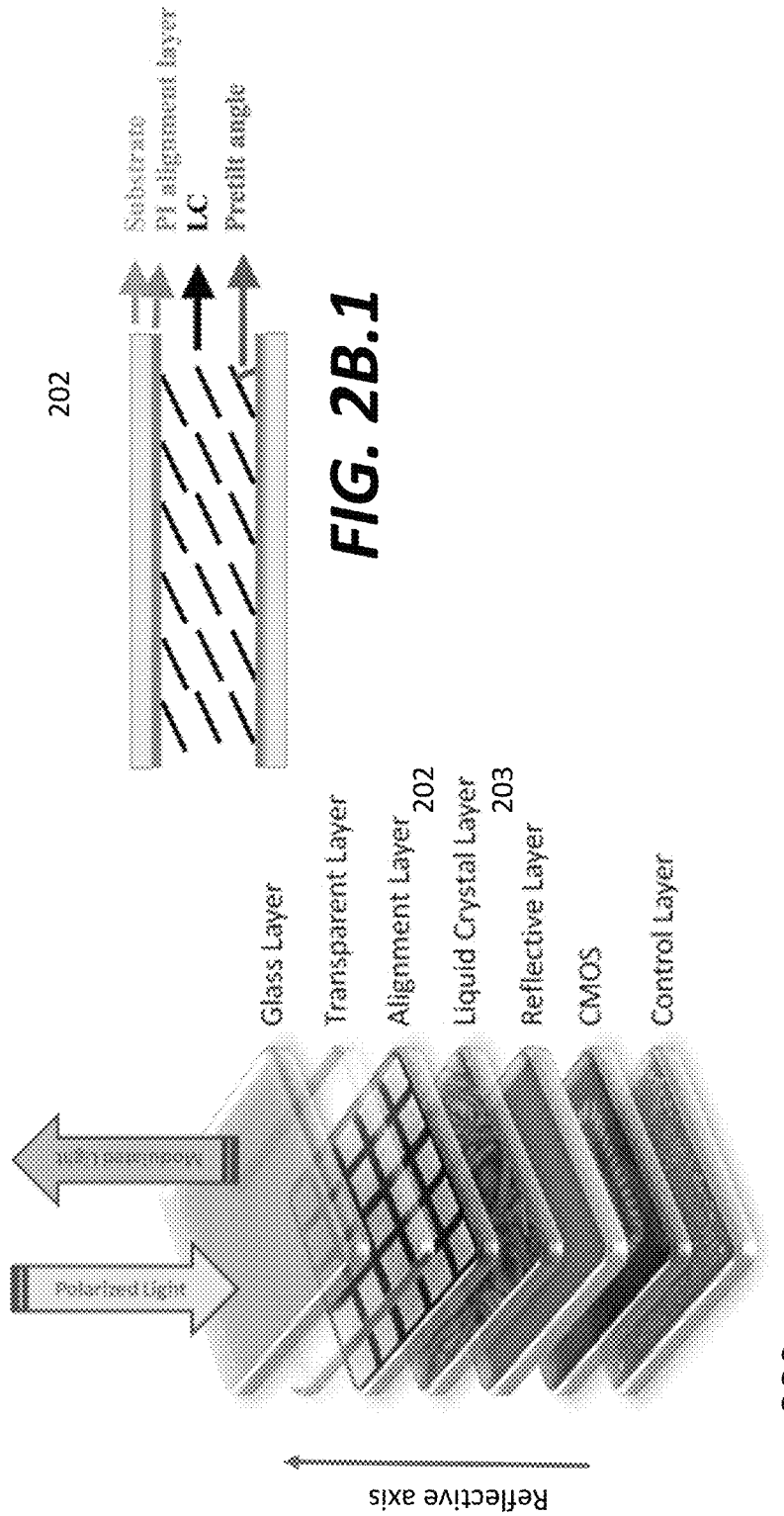

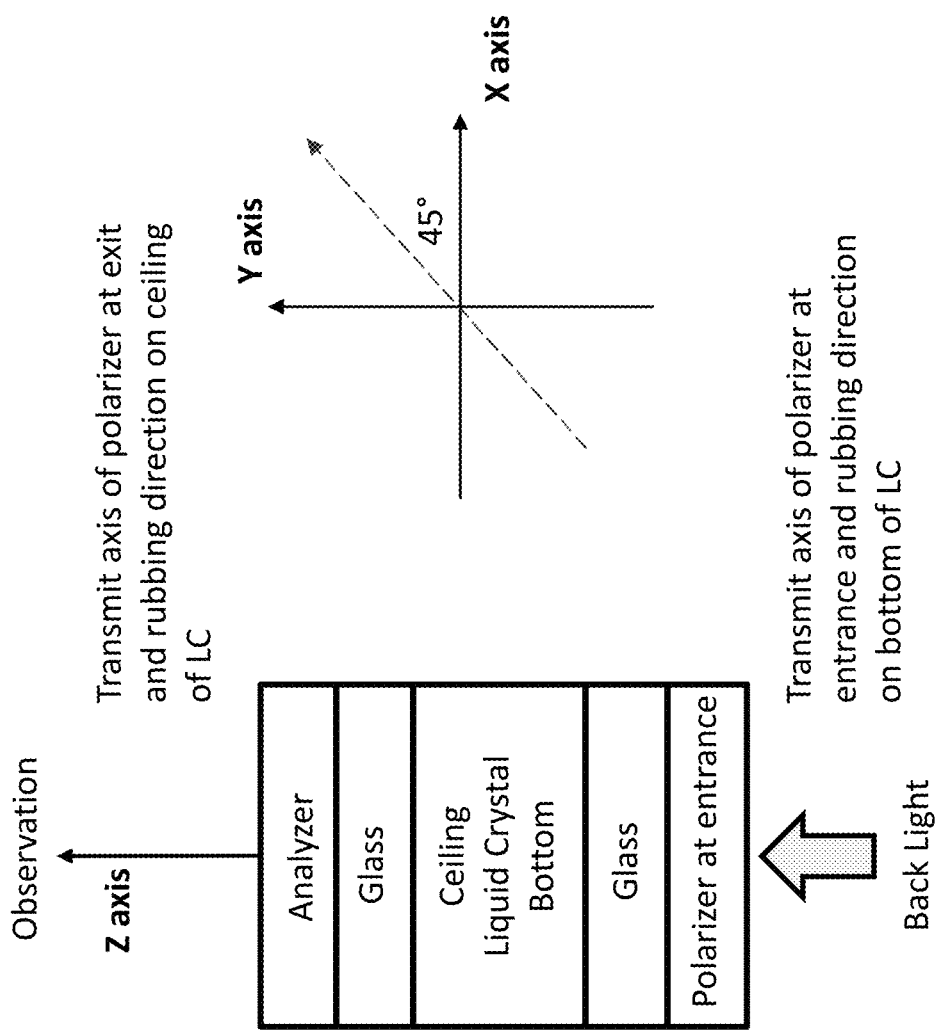
FIG. 2B.2

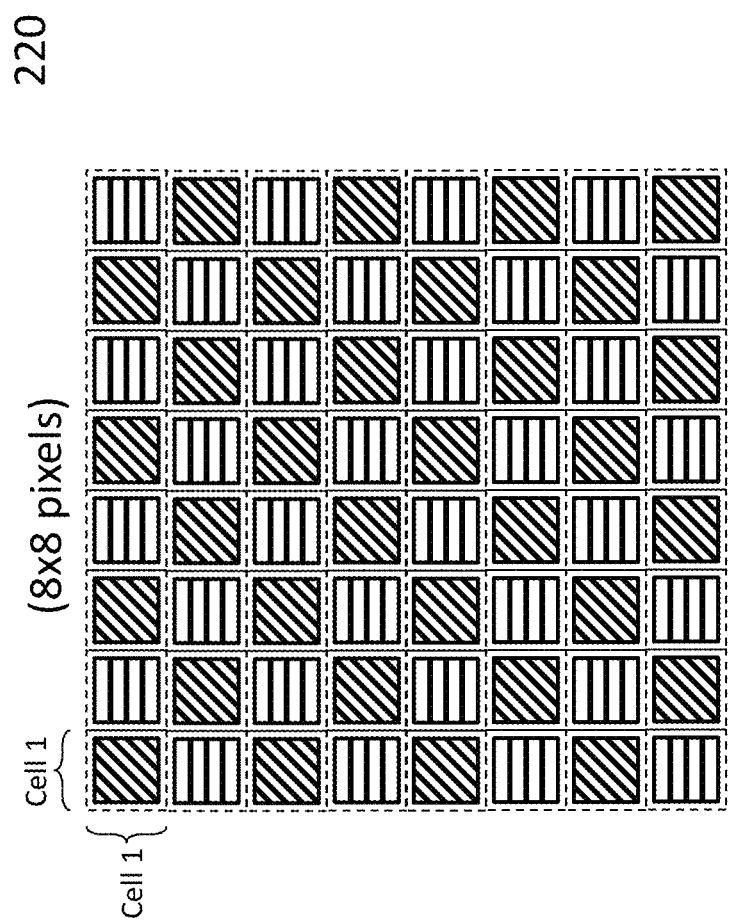

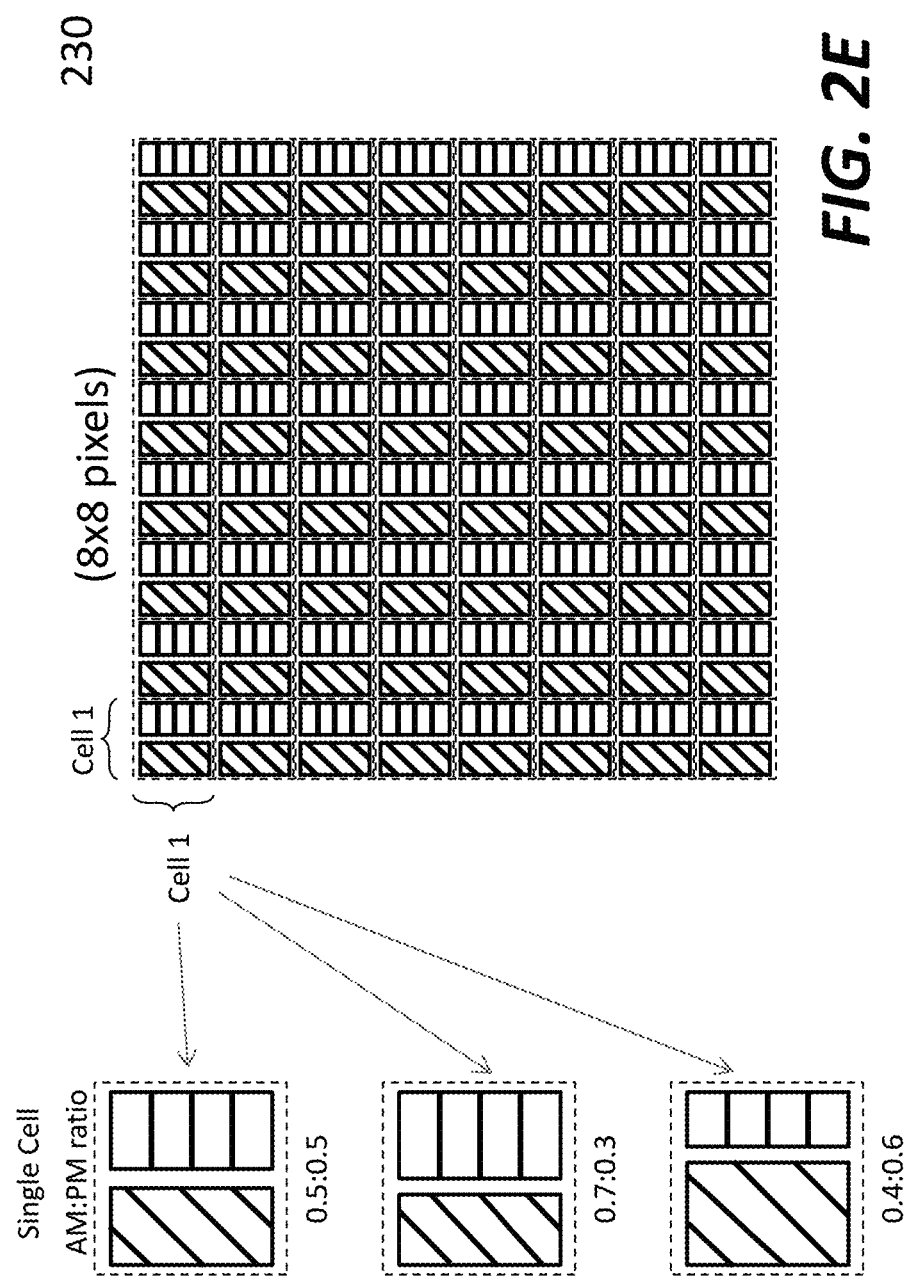

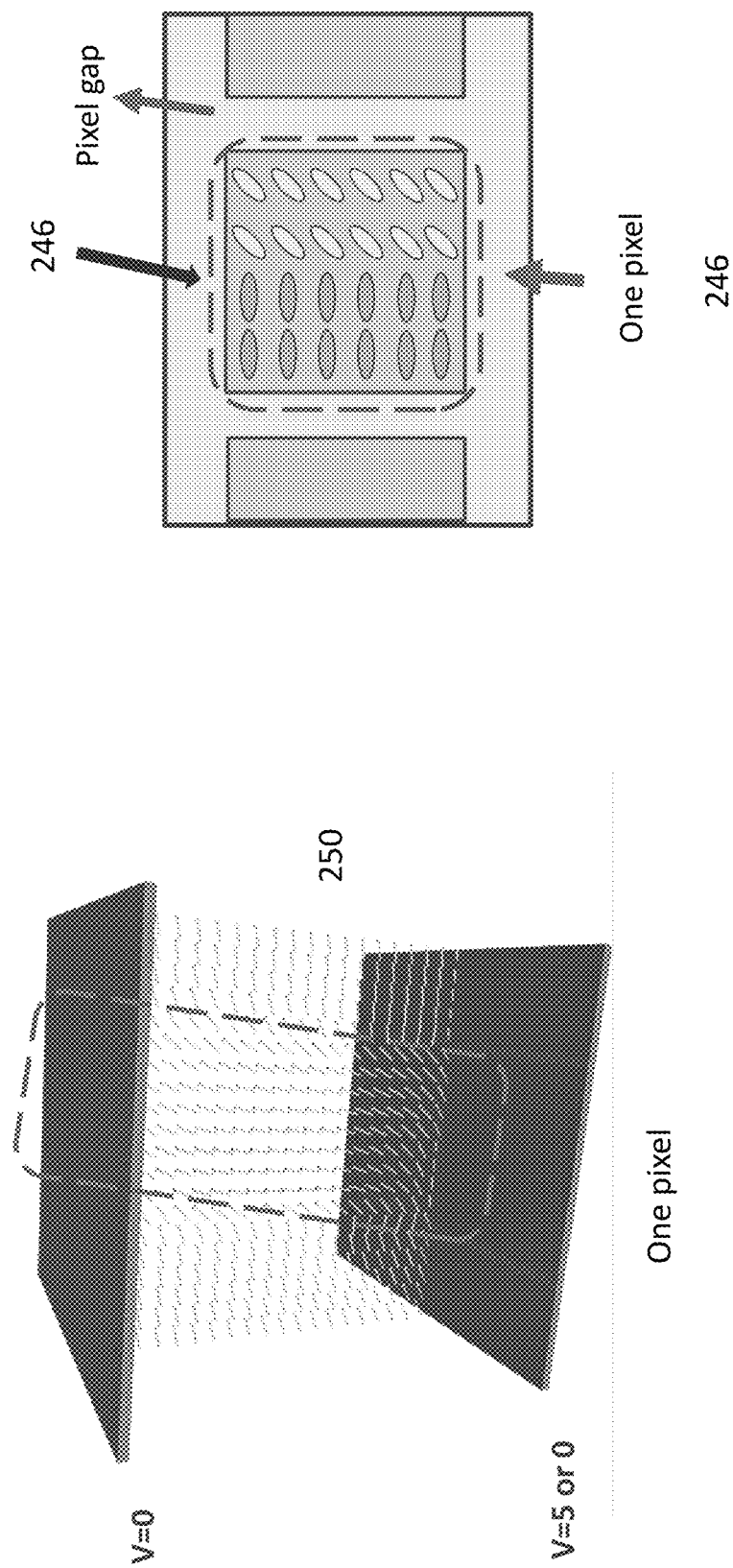
FIG. 2H.1
One pixel=6.4um, with 3.2um(half pixel) implement different photo alignment angle treatment

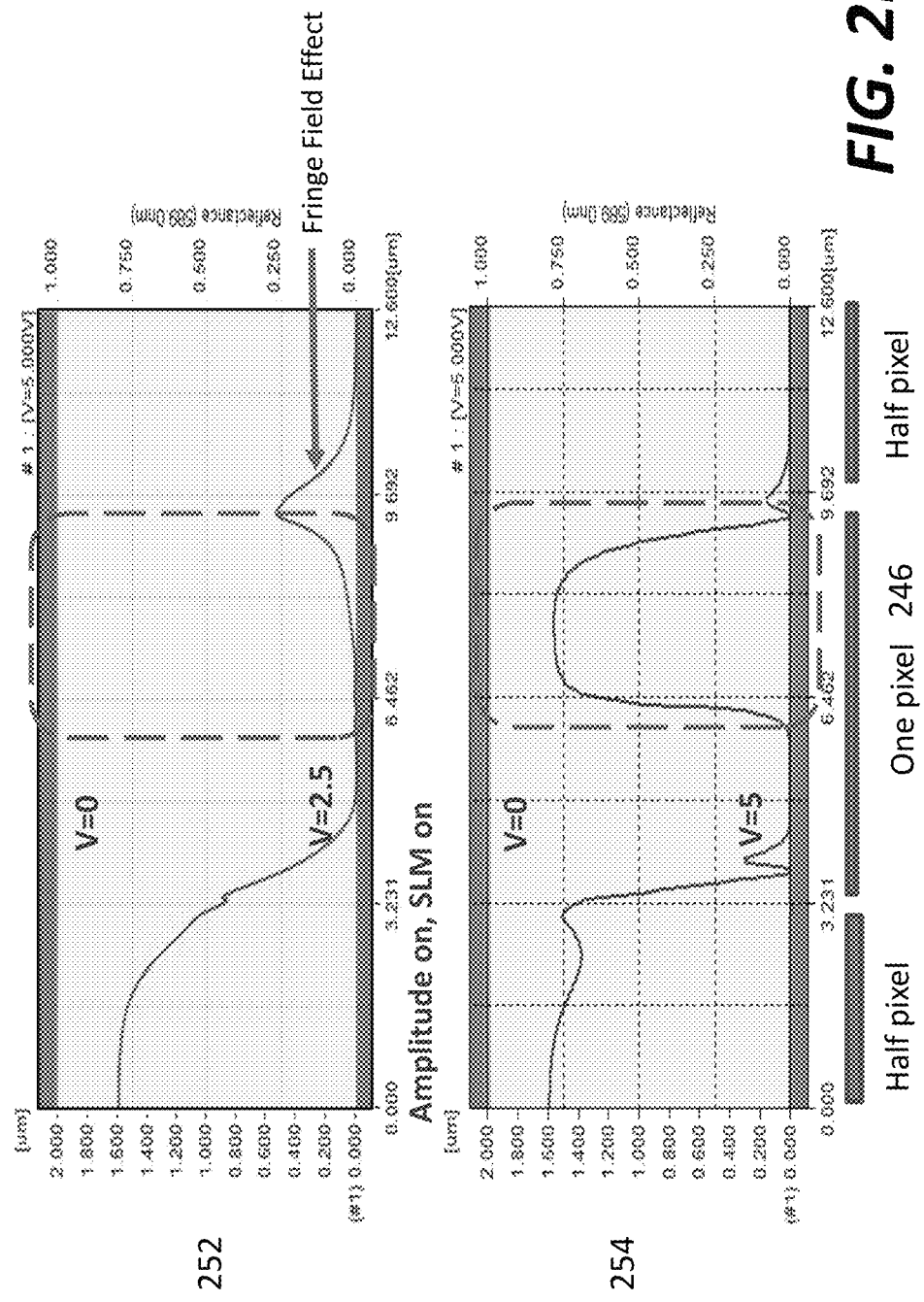

- Resolution: The higher, the better. (Reasonable N×M size is 4K×2K)
- Pixel Size: Around 1μm (<3.74 μm is acceptable)

Most scientific researcher's expectation:

Schematic of a tunable LC-SRG filter incorporating a SIGs structure.

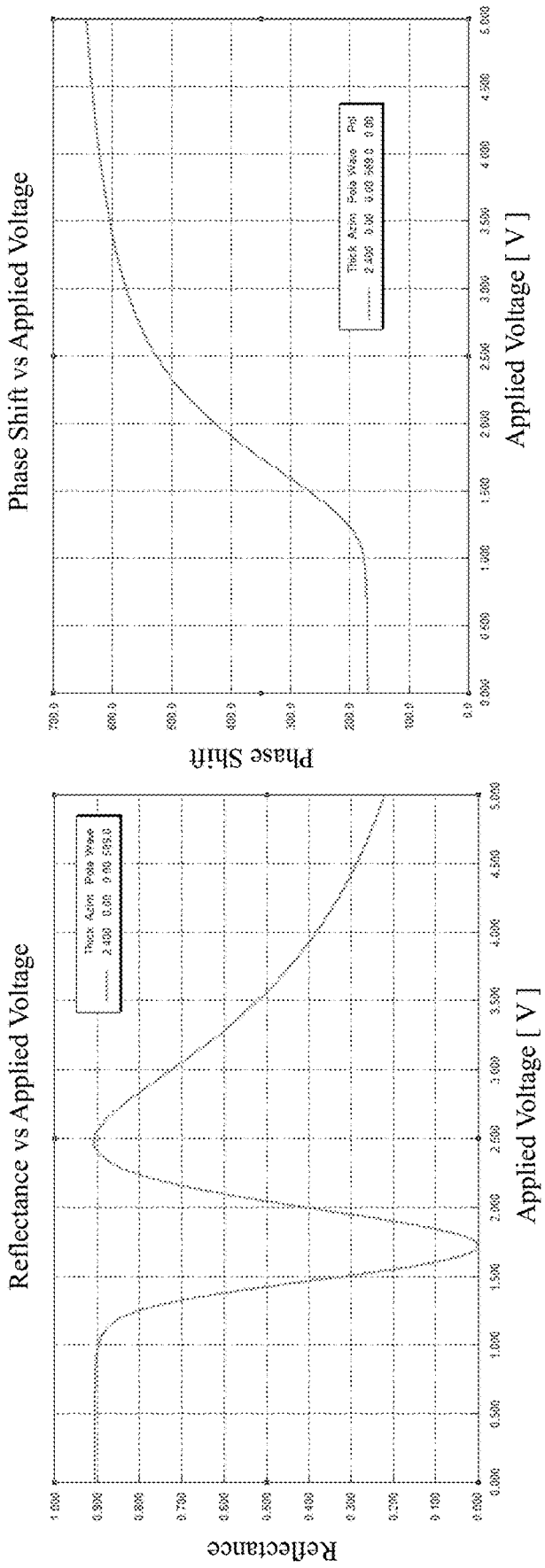
FIG. 6B.1

Eq.(2)
(b) $T = \cos^2\chi - \sin 2\beta \sin 2(\beta-\chi) \sin^2(\delta/2)$
Design of *Pi amplitude LCOS*, and the EO curve is presented
Eq.(3) $T_{\parallel} = \cos^2(\delta/2)$;
Eq.(4) $T_{\perp} = \sin^2(\delta/2)$;
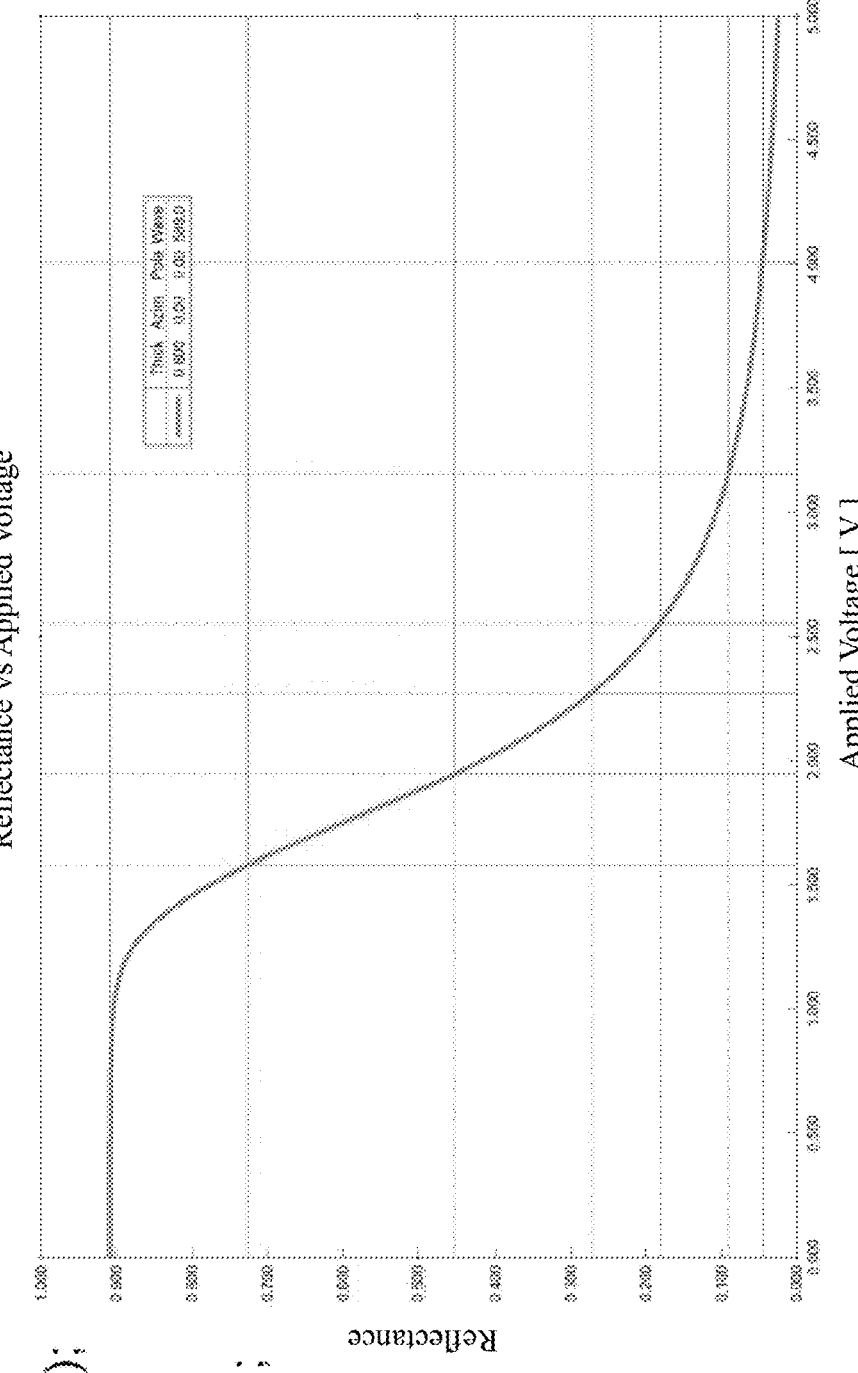
EO curve 616
*FIG. 6B.2*

- By applying additional higher driving voltage, signal or waveform of the AM & PM can always have a driving force for real-time display image signal: No relaxation mechanism is needed.
- Advantage: Achieve a fast response time and gray-to-gray response time due to driver returning to dark state won't suffer from relaxation mechanism again.

*A Pixel cell for Digital Driving Scheme*

*A Pixel cell for Analog Driving Scheme*

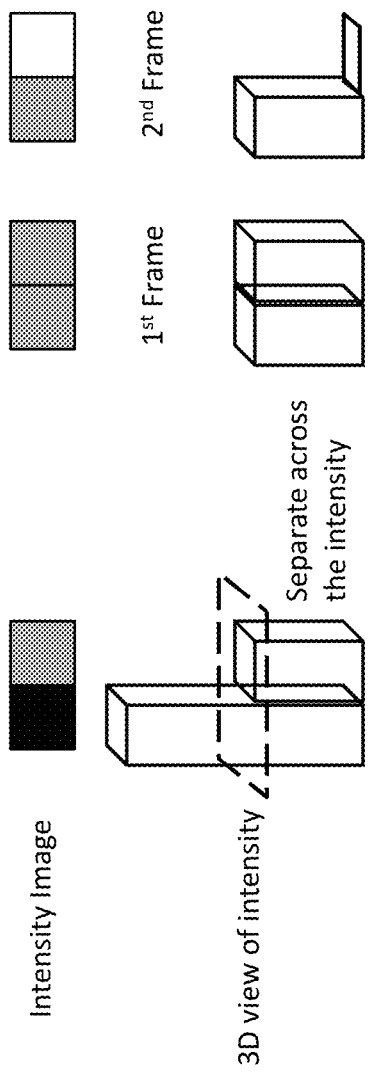

NANO-STAMPING TO CREATE TWO DIFFERENT GRATINGS TO MODULATE LIGHT IN AMPLITUDE AND PHASE VIA LIQUID CRYSTALS

BACKGROUND OF THE INVENTION

Field of the Invention

The present invention generally relates to the area of display devices and more particularly relates to method and architecture of modulating both amplitude and phase simultaneously within a pixel or within a single array of pixels, method and apparatus for creating embossed microstructures or specific alignment cells to control the amplitude modulation and the phase modulation, method and apparatus for controlling the optical characteristics of liquid crystals using photo alignment, nano-imprinting lithograph (NIL) and E-beam, and method and apparatus for controlling voltage being applied to a liquid crystal layer to realize the modulations of both amplitude and phase at substantively the same time.

Description of the Related Art

In a computing world, a display usually means two different things, a showing device or a presentation. A showing device or a display device is an output mechanism that shows text and often graphic images to users while the outcome from such a display device is a display. The meaning of a display is well understood to those skilled in the art given a context. Depending on application, a display can be realized on a display device using a cathode ray tube (CRT), liquid crystal display (LCD), light-emitting diode, gas plasma, or other image projection technology (e.g., front or back projection, and holography).

A display is usually considered to include a screen or a projection medium (e.g., a surface or a 3D space) and supporting electronics that produce the information for display on the screen. One of the important components in a display is a device, sometime referred to as an imaging device, to form images to be displayed or projected on the display. An example of the device is a spatial light modulator (SLM). It is an object that imposes some form of spatially varying modulation on a beam of light. A simple example is an overhead projector transparency.

Usually, an SLM modulates the intensity of the incident light. However, it is also possible to produce devices that modulate the phase of the light or both the intensity and the phase simultaneously. SLMs are used extensively in holographic data storage setups to encode information into an incident light in exactly the same way as a transparency does for an overhead projector. They can also be used as part of a holographic display technology.

Depending on implementation, images can be created on an SLM electronically or optically, hence electrically addressed spatial light modulator (EASLM) and optically addressed spatial light modulator (OASLM). This current disclosure is directed to an EASLM. As its name implies, images on an electrically addressed spatial light modulator (EASLM) are created and changed electronically, as in most electronic displays. An example of an EASLM is the Digital Micromirror Device or DMD at the heart of DLP displays or Liquid crystal on silicon (LCoS or LCOS) using ferroelectric liquid crystals (FLCoS) or nematic liquid crystals (electrically controlled birefringence effect).

Currently most daily watched displays and their related technologies, either at home or office, such as old CRT, LCD, OLED, LED billboard, camera, office projector, home theatre projector or even digital cinema projector in movie theatre, are only related to amplitude modulated intensity of images which are direct or indirect reproduced images as amplitude modulated display. As such a display is only dealing with amplitude or intensity of images, it is a two-dimensional image without depth of view. When an autostereoscopic method is used to create a 3D display, such as images in 3D movies based on binocularity of human eyes to create the 3D effect, it can cause fatigue on the eyes and would not have the true three dimensional scenes with multiple focuses of natural view.

As far as images displayed in 3D are concerned, there are significantly differences between "natural viewing or holographic 3D-display" and "autostereoscopic viewing with 3-D stereo display" due to depth cue mismatch of convergence and accommodation, resulting in the eye strain and fatigue. FIG. 1A provides an illustration 100 between natural viewing 102 and autostereoscopic viewing 104 with 3-D stereo display. It is well known that images formed on the retinas of two human eyes are 2D images. While the two eyes are seeing slightly different images, the fusion of these two images via the brain leads to depth perception, which is commonly referred to as binocular parallax. In other words, the brain uses binocular disparity to extract depth information from the two-dimensional retinal images in stereopsis.

The motion of head leads to different perspectives, which is commonly referred to as motion parallax. Both depth perception and motion parallax are needed in the real 3D displays. Any unreal 3D display can cause conflict in brain, leading to discomfort and possibly headache (fatigue). The current autostereoscopic viewing is missing depth perception and motion parallax.

In human vision, there are another two factors that determine natural 3D viewing: convergence and accommodation. In ophthalmology, convergence is the simultaneous inward movement of both eyes toward each other, usually in an effort to maintain single binocular vision when viewing an object. Accommodation is the process by which a human eye changes optical power to maintain a clear image or focus on an object as its distance varies. FIG. 1B summarizes these four factors that control the human natural viewing or a real 3D viewing.

Autostereoscopy is any method of displaying stereoscopic images (adding binocular perception of 3D depth) without the use of special headgear or glasses on the part of the viewer. As one can see from FIG. 1B, autostereoscopy is not real 3D display. Besides missing depth perception, there is one viewing perspective (no motion parallax) and the 3D depth perception remains fixed as the viewer moves around. Further, there are convergence/focus Issues. When a viewer focuses on a screen, his/her convergence on the object appears away from screen, resulting in conflicting information in the brain, hence often headache and/or motion sickness.

Multi-windows, image integral types, or holographic displays with images of continuous depth of focus or multiple focuses can achieve real 3D display like natural viewing. Such multi-focus depth images display often requires processing images with phase modulation to generate the real 3D display. However, such a technology is still at experimental level and not matured enough for real applications. Also, it is well known that the phase only modulation is in general not generating good image quality, often leading to mosaic-like images in low resolution. FIG. 1C shows a classic image 110 and an exemplary result 112 of applying phase modulation (PM) to the original image 110. Evidently, an exemplary result 114 looks much better when both of the amplitude modulation (AM) and phase modulation (PM) are applied to the original image 110.

In order to combine both AM and PM, there are many researches and experiments by utilizing two SLM devices, one to perform the AM, and the other to perform the PM only to establish an optical complicated system trying to achieve the good result. Although it is somehow successful in certain relative degree with a tedious and complicated set up in an optical lab to generate either reproduced holographic display or computer generated holography (CGH) display but still it is unable to overcome the problem of image superimposed issues and poor image quality due to two separate SLM devices located apart, resulting in differences in light traveling path, pixel to pixel alignment, wavelength deviation, and color aberration, besides a complicated and precision set-up of optical systems, such as 4f SLM optical systems or simply 4f systems in the industry.

FIG. 1D shows two exemplary systems using optical interconnection to combine both amplitude-only and phase-only SLMs. In a perspective, two SLMs are optically connected in series by an optical relay system such as the conventional 4-F system. Evidently, a system employing such an architecture would be bulky and high in cost. Further such a serial combination of two independent modulations results in still an image of poor quality. FIG. 1E shows a comparison between an image with phase modulation only and an image with such a serial combination of two independent phase and amplitude modulations. What is needed is an architecture modulating both amplitude and phase in spatial light modulation without using such two independent modulations coupled in series.

As a result, there is a strong need for a technique that can perform both AM and PM in a single SLM device or panel. Such a technique is strongly welcomed in many applications, especially in 3D holographics with clear, compact volume, high light efficiency, high contrast and high resolution real 3D holographic display.

In holographic displays, the extent of angular view-ability remains one of the most important factors affecting the experience of observing optically reconstructed holographic images. Due to the rapid progress in liquid crystal display technologies, spatial light modulators (SLM), such as LCoS devices, provide high accuracy in optical wave reproduction. However, the resolution of the display is often limited by a number of pixels and the finite pixel pitch of a particular SLM device used in the display implementation. Thus there is a further need for techniques that can display 3D holographics in higher resolution than the original resolution of an SLM device.

SUMMARY OF THE INVENTION

This section is for the purpose of summarizing some aspects of the present invention and to briefly introduce some preferred embodiments. Simplifications or omissions in this section as well as in the abstract and the title may be made to avoid obscuring the purpose of this section, the abstract and the title. Such simplifications or omissions are not intended to limit the scope of the present invention.

The present invention is generally related to architecture and designs of modulating both amplitude and phase in spatial light modulation without using two independent modulations coupled in series. According to one aspect of the present invention, light propagation is controlled in two different directions (e.g., 45 and 0 degrees) to perform both amplitude modulation (AM) and phase modulation (PM) at the same time in liquid crystals. According to another aspect of the present invention, a mask is used to form an array of embossed microstructures or a pattern, where the pattern includes an array of alignment cells, a first group of the cells are aligned in the first direction and a second group of the cells are aligned in the second direction. Depending on applications, two cells from the first group and the second group may correspond to a single pixel or two neighboring pixels, resulting in amplitude modulation and phase modulation within the pixel or within an array of pixels.

According to still another aspect of the present invention, the pattern in the mask includes a plurality of two differently aligned cells, one for the AM and the other for the PM. Each of the cells corresponding to a single pixel, causing light to be modulated in amplitude and phase at the same time within an array of pixels. Depending on implementation, the two differently aligned cells may be arranged in different ways including alternating across the entire array, between columns or rows of pixels, or according to a predefined pattern.

According to still another aspect of the present invention, the pattern in the mask includes groups of four pairs, each pair having two differently aligned cells, corresponding to a single pixel, causing light to be modulated in amplitude and phase, respectively in quadruple, at the same time within the pixel.

According to still another aspect of the present invention, the mask is created by using a similar process in semiconductor including deposition, etching and curing to create a designated pattern, where embossed microstructures or specific alignment cells are created and deposed on top of an alignment layer.

According to still another aspect of the present invention, the embossed microstructures or specific alignment cells are created with an e-beam technique to create very small structures in a resist that can be subsequently used or transferred to a substrate material to facilitate the modulations of both AM and PM in the liquid crystals.

According to still another aspect of the present invention, instead of using a photo mask, a nano-stamping technique, also referred to herein as nano-imprinting lithograph (NIL), is used to create two gratings to cause light modulations in amplitude and phase. Such two gratings may be applied to a single pixel or every two pixels across an entire array.

According to still another aspect of the present invention, instead of using a photo mask or nano-stamping technique, the voltage applied or coupled across liquid crystals is so controlled that the liquid crystals are caused to perform the AM in a range and the PM in another range when the voltage is gradually increased, where the characteristics of the liquid crystals is significant, for example, by increasing the thickness or gap of a layer of liquid crystals.

According to still another aspect of the present invention, an input image is first expanded into two frames based on the architecture of sub-pixels. A first frame is derived from the input image while the second frame is generated based on the first frame. These two frames are of equal size to the input image and displayed as AM image and PM image alternatively at twice the refresh rate originally set for the input image.

According to yet another aspect of the present invention, driving circuits in analog and digital are described, where each of the driving circuits may be used to apply a controlled voltage across one or more liquid crystals (as a pixel) to facilitate the AM and/or PM modulations in the liquid crystals.

The present invention may be implemented as an apparatus, a method, and a part of system. Different implementations may yield different benefits, objects and advantages. According to one embodiment, the present invention is a method in a spatial light modulator (SLM), the method comprises designating a first group of pixels performing amplitude modulation (AM); and designating a second group of pixels performing phase modulation (PM), wherein both of the AM and the PM take place substantially at the same time, the first group of pixels and the second group of pixels are within a single array, both of the AM and the PM are performed via a layer of liquid crystals sandwiched between a transparent electrode layer and a electrode layer, where the electrode comprises an array of pixel electrodes, each controlling one of the pixels, and is built on a silicon substrate.

According to another embodiment, the present invention is a spatial light modulator (SLM) comprising a first group of pixels performing amplitude modulation (AM); and a second group of pixels performing phase modulation (PM), wherein both of the AM and the PM take place simultaneously, wherein the first group of pixels and the second group of pixels are within a single array, both of the AM and the PM are performed via a layer of liquid crystals sandwiched between a transparent electrode layer and a reflecting electrode layer, where the reflecting electrode comprises an array of pixel electrodes, each controlling one of the pixels, and is built on a silicon substrate.

According to still another embodiment, the present invention is a spatial light modulator comprising a layer of liquid crystals of a predefine thickness sandwiched between a transparent electrode layer and a reflecting electrode layer, an alignment layer deposed on top of the layer of liquid crystals, and a photo mask including a plurality of alignment cells in rows and columns and deposed on the alignment layer, wherein the reflecting electrode comprises an array of pixel electrodes, each controlling one of pixels in two-dimensional (2D) array, and is built on a silicon substrate, a first group of the alignment cells are oriented in a first direction and a second group of the alignment cells are oriented in a second direction, light going through the first group of the alignment cells is modulated in amplitude thereof and the light going through the second group of the alignment cells is modulated in phase thereof, all via the liquid crystals and at the same time.

According to still another embodiment, the present invention is a method in a spatial light modulator, the method comprises deposing a mask on top of an alignment layer, wherein the alignment layer is provided to a layer of liquid crystals, with a predefined thickness, sandwiched between a transparent electrode layer and a reflecting electrode layer, the reflecting electrode comprises an array of pixel electrodes, each controlling one of pixels in two-dimensional (2D) array, and is built on a silicon substrate, and wherein the mask includes a plurality of alignment cells in rows and columns, a first group of the alignment cells are oriented in a first direction and a second group of the alignment cells are oriented in a second direction, light going through the first group of the alignment cells is modulated in amplitude thereof and the light going through the second group of the alignment cells is modulated in phase thereof, all via the liquid crystals and at the same time.

According to still another embodiment, the present invention is a spatial light modulator comprising: a layer of liquid crystals, with a predefined thickness, sandwiched between a transparent electrode layer and a reflecting electrode layer, wherein the reflecting electrode comprises an array of pixel electrodes, each controlling one of pixels in two-dimensional (2D) array, and is built on a silicon substrate; and at least a first layer of grating attached to the layer of liquid crystals, wherein the first layer of grating is formed by a layer of transparent material imprinted with a stamp, wherein the first layer of grating includes a shallow or short-pitch grating for liquid crystal alignment superimposed onto a deeper or large-pitch grating so as to cause light modulations in amplitude and phase.

According to still another embodiment, the present invention is a method for making a spatial light modulator, the method comprising: providing a layer of monomer liquid on a transparent substrate; pressing a stamper onto the monomer liquid to create imprints in the monomer liquid; curing the monomer liquid to create the first layer of grating with a short-pitch grating and a large-pitch grating; and forming on top of the first layer of grating a layer of liquid crystals, with a predefined thickness, wherein light is modulated in amplitude and phase with the short-pitch grating and the large-pitch grating via the liquid crystals.

According to still another embodiment, the present invention is a method for modulating light in amplitude and phase simultaneously in liquid crystals, the method comprises: coupling a voltage across a layer of liquid crystals, where the voltage is supplied from a driving circuit, the voltage includes a plurality of step volts from a voltage level VL to VH and is impulsively increased to VP, VL is at least above Vth, a threshold voltage, VH is a voltage level that causes to twist the liquid crystals, and VP is a voltage level greater than the voltage level VH for a moment to minimize or eliminate a free relaxation time that would otherwise happen when the voltage level VH drops. The method further comprises increasing the voltage level to twist the liquid crystals gradually from substantially blocking the incident light to fully passing incident light therethrough and again from substantially blocking the incident light to fully passing the incident light therethrough.

According to yet another embodiment, the present invention is a spatial light modulator for modulating light in amplitude and phase simultaneously in liquid crystals, the spatial light modulator comprises: a layer of liquid crystals; a power source generating a voltage coupled across the layer of liquid crystals, where the voltage includes a plurality of step volts from a voltage level VL to VH and is impulsively increased to VP, VL is at least above Vth, a threshold voltage, VH is a voltage level causing to twist the liquid crystals, and VP is a voltage level greater than the voltage level VH for a moment to minimize or eliminate a free relaxation time that would otherwise happen when the voltage level VH drops; and a controller to control the power source to increase the voltage level VP to twist the liquid crystals gradually from substantially blocking an incident light to fully passing the incident light therethrough and again from substantially blocking the incident light to fully passing the incident light therethrough.

There are many other objects, together with the foregoing attained in the exercise of the invention in the following description and resulting in the embodiment illustrated in the accompanying drawings.

BRIEF DESCRIPTION OF THE DRAWINGS

These and other features, aspects, and advantages of the present invention will become better understood with regard to the following description, appended claims, and accompanying drawings where:

FIG. 2A shows an exemplary LCoS structure producing 2-dimensional optical image (i.e., 2D varying intensities of light or modulated light to get gray levels of images);

FIG. 2B.1 shows an exemplary cross view of an LC layer with the alignment layer, where the pretilt alignment (rubbing) angle dictates the characteristics of light going through the LC molecules;

FIG. 2B.2 shows functional layers in an exemplary LCoS;

FIG. 2D shows an exemplary 8×8 array of alignment cells (, each corresponding to one pixel;

FIG. 2E shows an array of alignment cells, each of the cells designed for both AM and PM, which in operation appears to have dissected each pixel into two parts alternating across an entire SLM device, allowing one half of the pixel to perform the AM and the other half to perform PM at the same time, with different ratios of AM to PM;

FIG. 2H.1 and FIG. 2H.2 together show a simulation result on a single pixel without involving the neighboring pixels;

FIG. 6B.1 and FIG. 6B.2 together shows an EO curve and a phase curve based on Equation (1) and an EO curve based on Equation (2);

FIG. 8D illustrates an image of two pixels, one being full intensity (shown as black) and the other one being one half of the full intensity (shown as grey);

DETAILED DESCRIPTION OF THE PREFERRED EMBODIMENTS

Figure 1A:
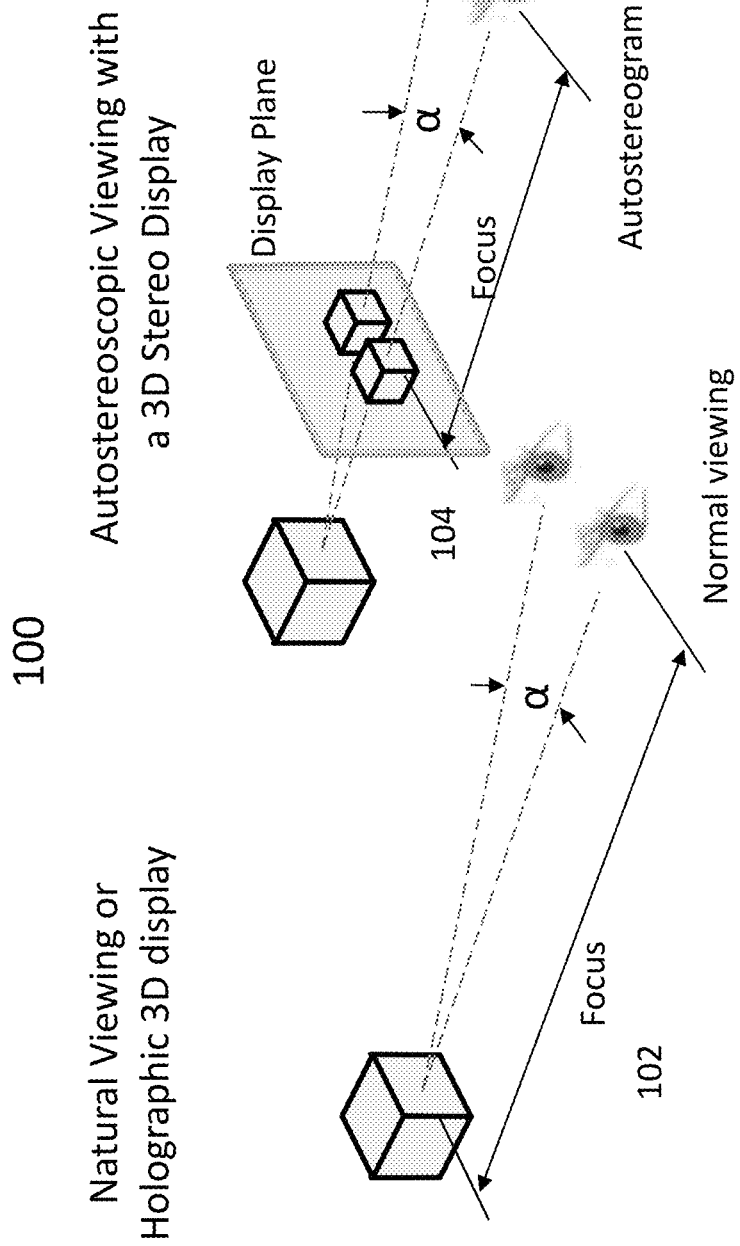
FIG. 1A provides an illustration between natural viewing and autostereoscopic viewing with 3-D stereo display.
Figure 1B:
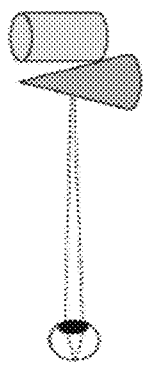
FIG. 1B summarizes four factors that control the human natural viewing or a real 3D viewing.
Figure 1B:
Figure 1B:
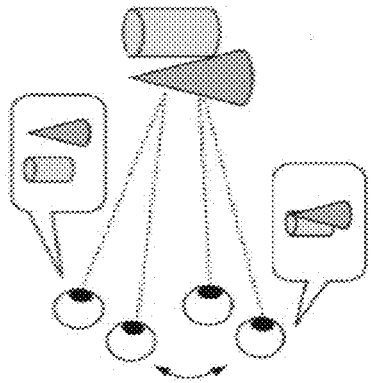
Figure 1B:
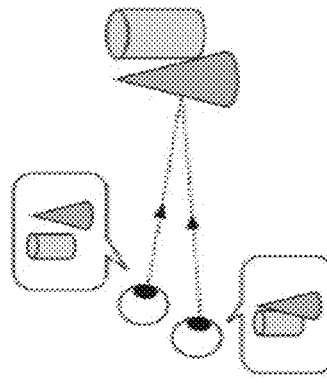
Figure 1C:
FIG. 1C shows an exemplary result of applying phase modulation to a classic original image.
Figure 1C:
Figure 1C:
Figure 1D:
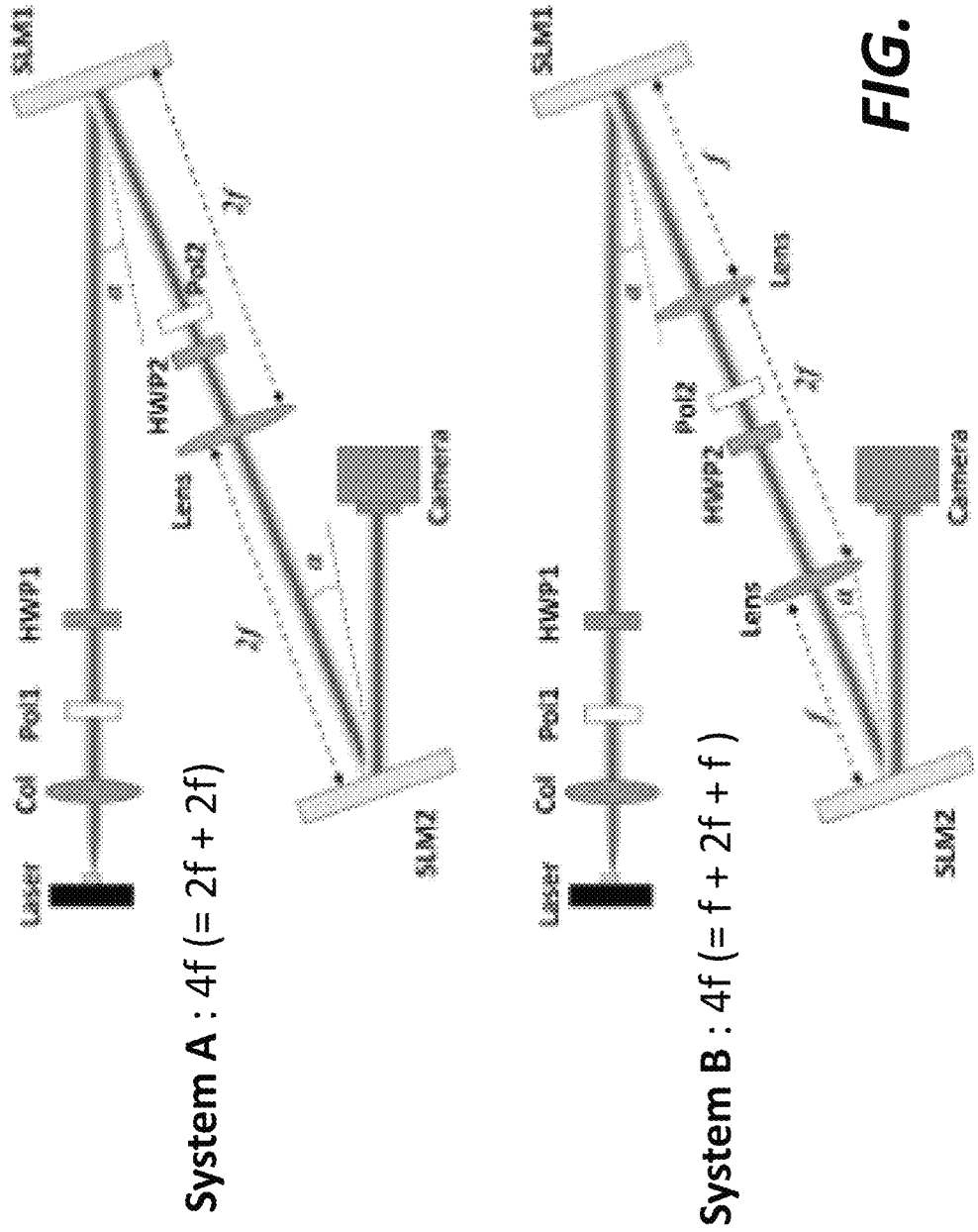
FIG. 1D shows an exemplary prior-art architecture using optical interconnection to combine both amplitude and phase SLMs, where two SLMs are optically connected in series by an optical relay system, such as the conventional 4-F system.
Figure 1E:
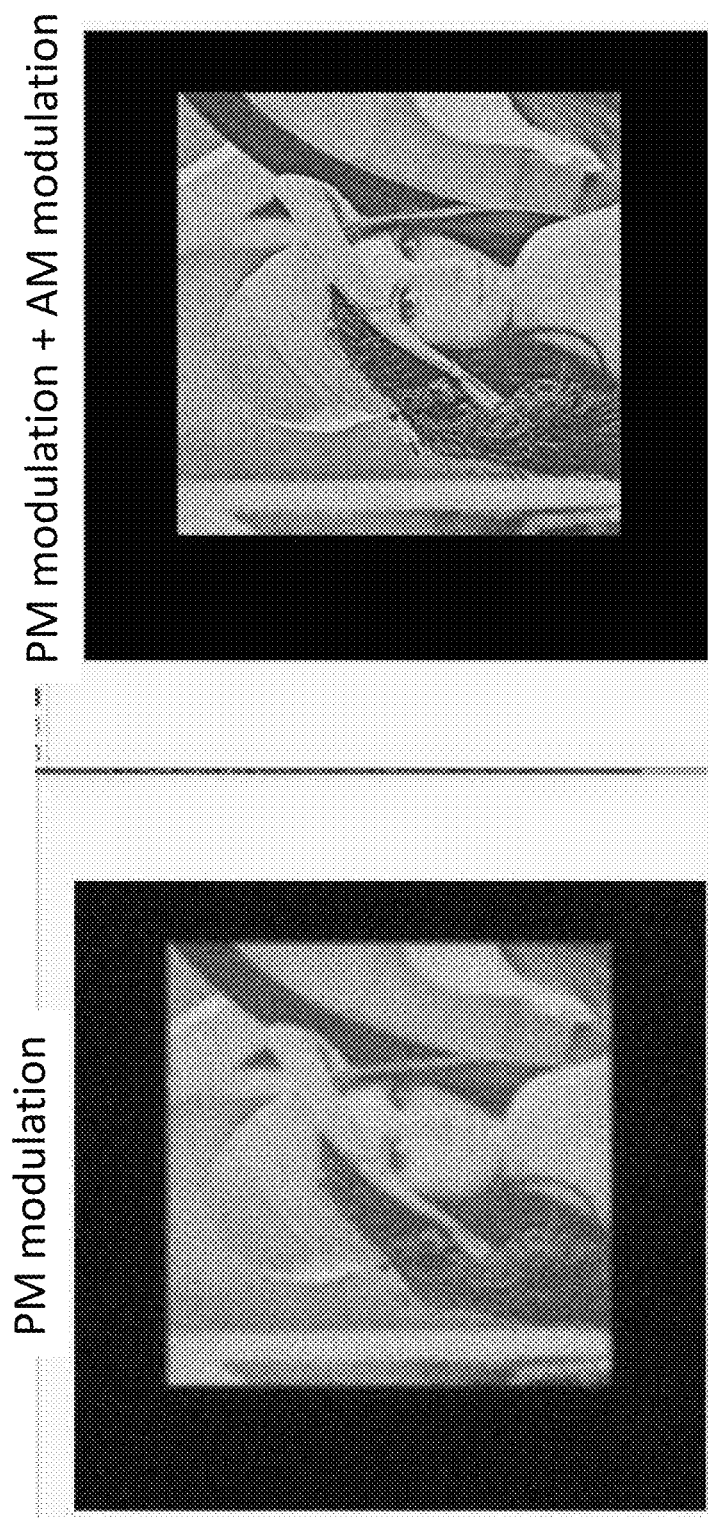
FIG. 1E shows a comparison between an image with phase modulation only and an image with such a serial combination of two independent phase and amplitude modulations.

The detailed description of the invention is presented largely in terms of procedures, steps, logic blocks, processing, and other symbolic representations that directly or indirectly resemble the operations of optical signals, light, signals or data processing devices. These process descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

The present invention is generally related to devices that can be advantageously used in holographic displays of high quality images based on two simultaneous spatial light modulations (SLM), where the modulations include both amplitude modulation (AM) and phase modulation (PM) that occur simultaneously in a single device or panel (e.g., a microdisplay) or even within each of the individual pixels in a single SLM microdisplay panel. Various implementations are described. Supporting circuitry is also described herein to support such simultaneous AM and PM.

The present invention may be implemented in a single SLM device or panel (microdisplay). To facilitate the description of the present invention, an example of such SLM microdisplay, LCoS, is used herein for illustration. Those skilled in the art can appreciate that the description herein is equally applicable for other types of display devices demonstrating similar characteristics as in SLM device or LCoS.

LCoS or LCOS stands for liquid crystal on silicon, a miniaturized active-matrix liquid-crystal display or "microdisplay" using a liquid crystal layer on top of a silicon backplane. It is also referred to as a spatial light modulator. In an LCoS display, a semiconductor chip (e.g., CMOS) controls the voltage on square reflective aluminum electrodes buried just below the chip surface, each controlling one pixel. For example, a chip with XGA resolution will have 1024×768 plates, each with an independently addressable voltage. Typical cells are about 1-3 centimeters square and about 2 mm thick, with pixel pitch as small as 2.79 μm or smaller, and a (LC) layer with cell (gap) thickness being 1-3 μm. A common voltage for all the pixels is supplied by a transparent conductive layer made of, for example, indium tin oxide (ITO) on a cover glass.

LCoS can be a transmissive or reflective device, generating modulated light from a light source (e.g., white, RGB lights or lasers) for a lens or prism to collect, where the light is then displayed on a medium as an image. To facilitate the description of the present invention, the LCoS is deemed as a reflective device, namely an incident light is impinged upon thereon and reflected by the LCoS to form an optical image (a.k.a., modulated light). One of the important advantages, benefits and objectives in the present invention is that the modulated light is from two simultaneous modulations in amplitude and the phase.

FIG. 2A shows an exemplary structure 200 of LCoS. In a perspective, the LCoS produces 2-dimensional optical image (i.e., 2D varying intensities of light or modulated light). It is very well known, a digital image can be transmitted via a data cable but an optical image cannot be transmitted via such a data cable. In general, an optical image can be transported via an optical medium (e.g., air, waveguide or fibers) depending on applications. Instead of using tiny mirrors that turn on and off, LCoS uses liquid crystals as light modulators by turning angles thereof to control the amount of reflected light.

A liquid crystal (LC) is a substance that is in mesomorphic state (not exactly a liquid or a solid). Its molecules usually hold their shape, like a solid, but they can also move around, like a liquid. Nematic liquid crystals, for example, arrange themselves in loose parallel lines. A layer of liquid crystals (or a LC layer) is positioned, sandwiched or coupled between a transparent electrode layer and a reflecting electrode layer, where the reflecting electrode comprises an array of pixel electrodes and is built on a silicon substrate. It should be noted that there are other layers integrated with the LC layer between the transparent electrode layer and the reflecting electrode layer. As used herein, the term "positioned", "sandwiched" or "coupled" between two layers does not mean there is only one item between the two layers. Other layers of materials or components may be added on top of the item or sandwich the item to alter, modify or enhance the behavior, performance or characteristics of the item, all between the two layers. When placed between two polarized layers, the twisted crystals guide the path of light. When a voltage difference is applied between the transparent electrode layer and one pixel electrode, LC molecules therebetween are re-orientated with an applied electric field. By changing the direction of the light, the crystals allow or prevent its passage therethrough.

The molecules of liquid crystals are usually much longer than they are wide. In a rod-like liquid crystal, the molecules are oriented in the same direction locally, giving rise to optical birefringence, i.e. the index of refraction along the long axis of the molecule is significantly different than the optical index perpendicular to it. In another words, birefringence is the optical property of a material having a refractive index that depends on the polarization and propagation direction of light. Without further getting into the details of the molecules and/or the liquid crystals and how they affect the birefringence, which beyond the scope of the present invention, it is known that controlling how the light or the polarization and propagation direction of light entering the liquid crystals dictates the reflectance or transmittance of the light going through the LC layer.

When a voltage difference is applied between the transparent electrode layer and one pixel electrode, LC molecules therebetween are re-orientated with an applied electric field. By changing the direction of the light, the crystals allow or prevent its passage therethrough. Since the LC is birefringent, the orientation results in a phase shift, commonly known phase retardation, to the light, where the phase retardation is controllable by the voltage difference due to the Electric Controlled Birefringence Effect, ECB Mode).

When a linear polarized incident light enters the LC layer at an angle of ϕ to the director axis of the liquid crystal, it is split into two beams with different polarizations, namely the extraordinary wave (E-light), in which the polarization direction is parallel to the liquid crystal axis, and the ordinary wave (O-light), in which the polarization direction is perpendicular to the axis. Since the E-light and the O-light pass through the liquid crystal with different velocities, their indices of refraction are different. Consequently, a phase difference δ exists between the two waves when they emerge from the liquid crystal, i.e.:

$$\delta = 2\pi d \left( \frac{1}{\lambda_e} - \frac{1}{\lambda_o} \right) = 2\pi d \frac{(n_e - n_o)}{\lambda_v} = \frac{2\pi d \Delta n}{\lambda_v} \qquad \text{Eq. (1)}$$

where d is the cell gap (i.e., the thickness of the LC layer), Δn depends on the applied voltage, the temperature, and the wavelength of the incident light $\lambda_v$, and is given by $\Delta n = n_e - n_o$, which is also referred to as birefringence.

When a homogeneous cell is sandwiched between two polarizers, the normalized light transmittance is governed by the following equation:

$$T = \cos^2 X - \sin 2\beta \sin 2(\beta - X) \sin^2(\delta/2);  \quad\quad \text{Eq. (2)}$$

where X is the angle between the polarizer and an analyzer, β is the angle between the polarizer and the LC directors, and δ is the phase retardation expressed in the Equation 1. For the simplest case that β=45 degrees and the two polarizers are either parallel (X=0) or crossed (X=90), the normalized light transmittances are simplified to:

$$T_{//} = \cos^2(\delta/2);  \quad\quad \text{Eq. (3)}$$

$$T_{\perp} = \sin^2(\delta/2);  \quad\quad \text{Eq. (4)}$$

As further shown in FIG. 2A, there is an essential part, the alignment layer, that dictates the macroscopic uniform alignment of liquid crystalline molecules (mesogens) near its surface, essentially to orientate the LC molecules with a specific pretilt angle, which is the angle between the director of the LC molecules and the alignment layers. FIG. 2B.1 shows an exemplary cross view of an LC layer with the alignment layer, where the pretilt alignment dictates the characteristics of light going through the LC molecules. Different pretilt alignment angles may produce very different modulated lights, so does the thickness of the LC (e.g., a corresponding light path therethrough). There are ways of forming the surface alignment layer. One example is to use unidirectional mechanical rubbing of thin polyimide coating. A thin film is spin coated and then cured at appropriate temperature according to the polyimide type. Thereafter, the cured film is rubbed with a velvet cloth, producing micro or nano grooves along the rubbing direction to which the LC molecules are aligned accordingly. FIG. 2B.2 shows functional layers in an exemplary LCoS.

Figure 2C:
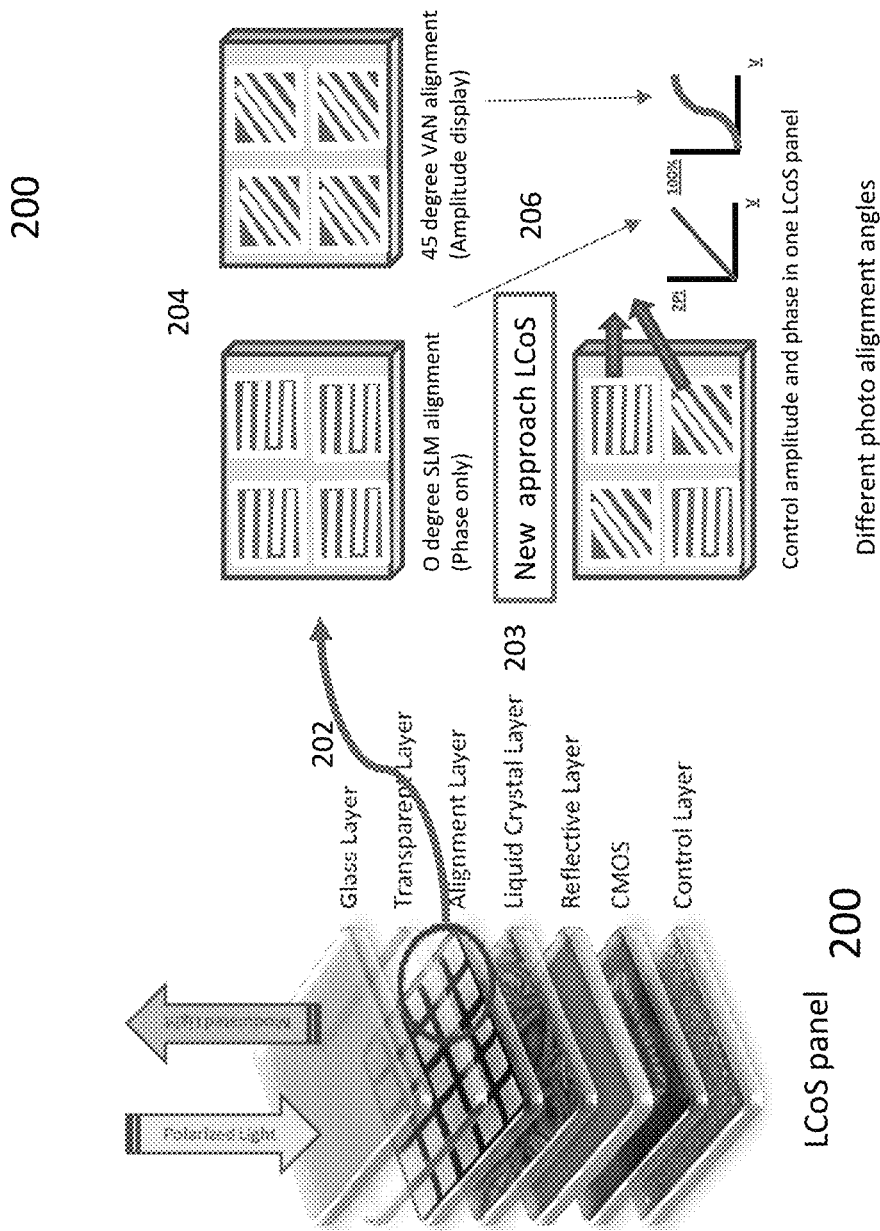
FIG. 2C, it shows an example of how an LCoS may be modified or redesigned to implement one embodiment of the present invention.

Referring now to FIG. 2C, it shows an example of how an LCoS 200 can be modified or redesigned to implement one embodiment of the present invention. As in a prior art LCoS, an alignment layer 202 is deposed on top of a layer of liquid crystals 203 (i.e., a LC layer) to configure the liquid crystals to have pre-determined pretilt alignment angles over the entire array of pixels. An incident light is transmitted through the LC layer with almost zero absorption. The integration of high-performance driving circuitry allows the applied voltage to be changed on each pixel, thereby controlling the phase retardation of the incident wavefront across the device. Currently, there are two types of light modulation using LCoS devices, amplitude modulation (AM) and phase modulation (PM). In the AM case, the amplitude of the light signal is modulated by varying the linear polarization direction of the incident light. In the PM case, the phase delay is accomplished by electrically adjusting the optical refractive index along the light path. The details of how an incoming light is modulated by the liquid crystals (LC) or in the LC layer are not to be further described to avoid obscuring aspects of the present invention. One of the objectives, benefits and advantages in the present invention is to control the pretilt alignment angles via a modified alignment layer or an array of alignment cells integrated with an alignment layer. To facilitate the description of the present invention, for AM, all the alignment cells are diagonally aligned (e.g., neither horizontally nor vertically aligned, or between 20-60 degrees), and for PM, all the alignment cells are horizontally aligned, meaning starting from 0 degrees to 360 degrees and beyond.

It shall be noted, throughput the description herein, that an alignment layer is used as a substrate to form or hold the alignment cells (or embossed microstructures). Those skilled in the art can appreciate from the description herein that the alignment cells being described may very well be incorporated into the alignment layer when it is designed or formed. To facilitate the description of the present invention, the alignment cells are assumed to be formed on top of an alignment layer.

According to one embodiment of the present invention, the two differently aligned cells are arranged in such a way 206 that their alignments alternate across the entire alignment layer, namely the alignment of each cell is different from that of its neighboring cells. In other words, the alignments of the cells are alternating from AM to PM. In operation, both AM and PM happen simultaneously when a light goes through these cells and the LC layer is applied with proper voltages or currents. One of the advantages, benefits and objectives in the present invention is to have both AM and PM happen at the same time in an SLM device (e.g., LCoS panel). As all of the light is simultaneously modulated in phase and amplitude, a holographic image reproduced from such an implementation can be in high resolution with high efficiency.

FIG. 2D shows an exemplary 8×8 array of alignment cells, each corresponding to one pixel. According to one embodiment shown in FIG. 2D, the alignment cells for AM and PM are alternating across an entire SLM device, namely alternating pixels in odd and even row or column within one SLM device. In a perspective, one half of the pixels perform the AM and the other half of the pixels perform the PM at the same time. In some modified embodiments, the alignment cells may be randomly chosen for AM and PM or a desire pattern is designed to define certain pixels or groups of pixels for AM or PM.

According to another embodiment shown in FIG. 2E, the alignment cells for AM and PM are within one single pixel by dissecting each pixel, for example, into two parts alternating across an entire SLM device, allowing one half of the pixel to perform AM and the other half to perform PM at the same time. Depending on the implementation, the percentage of one pixel for performing AM or PM may be 50% or predefined per a desired performance, some of which are also shown in FIG. 2E.

As far as light efficiency is concerned, it is estimated according to one prior art system that the holographic display based on amplitude modulation is very low (e.g., roughly only 5%) while the efficiency is increased (e.g., to 95%) based on phase modulation. With the integrated AM and PM, the light efficiency can be considerably increased without losing the resolutions.

Figure 2F:
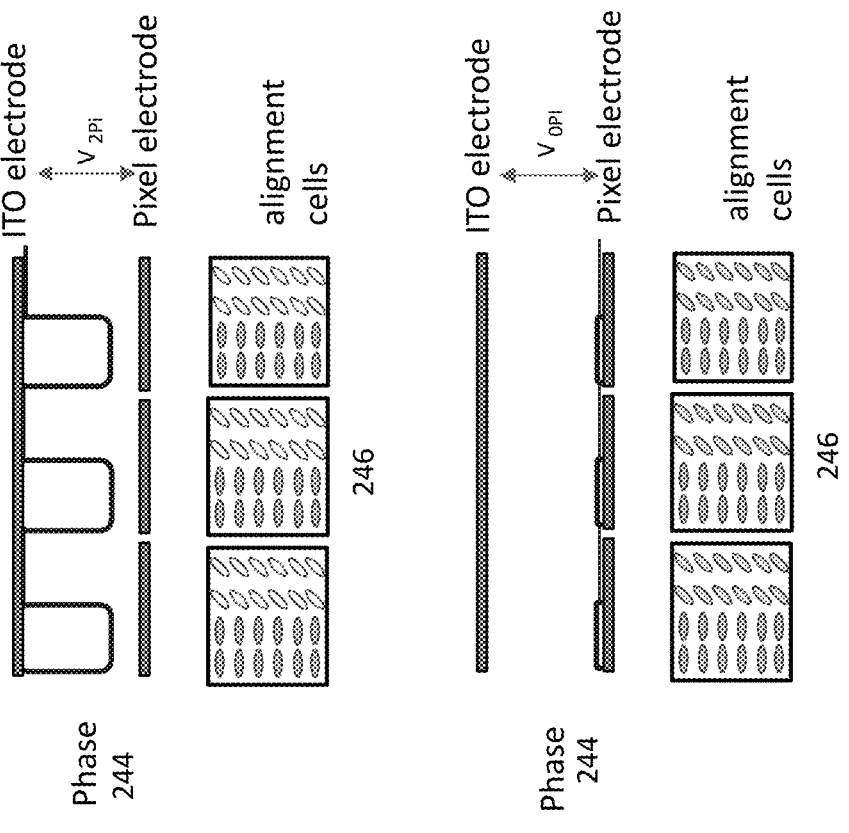
FIG. 2F shows two separate illustration curves, one being a reflectance curve as AM and the other being the phase curve as PM.
Figure 2F:
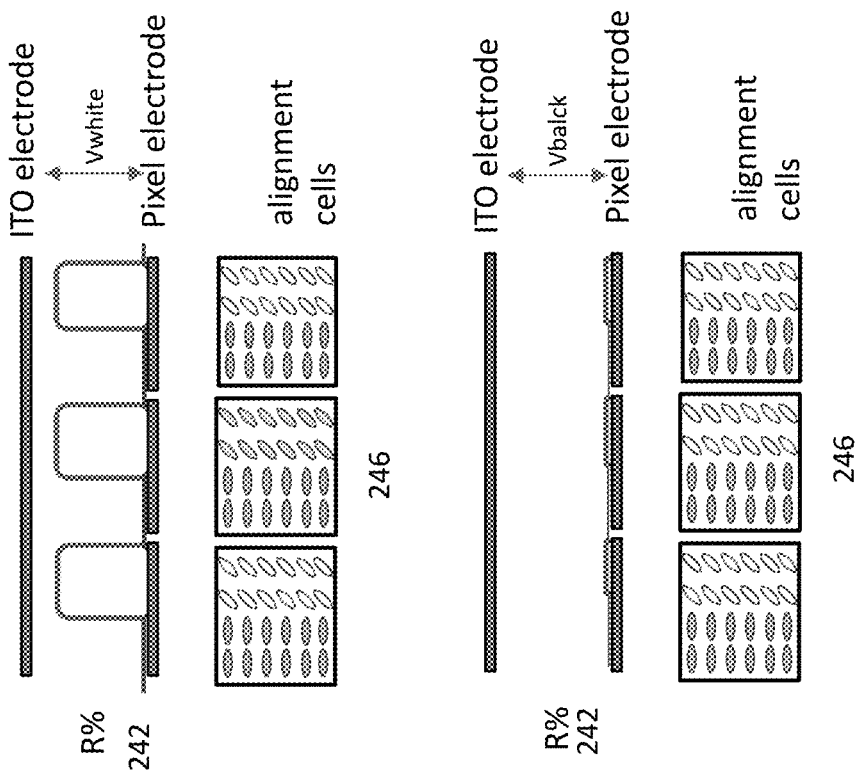
Figure 2G:
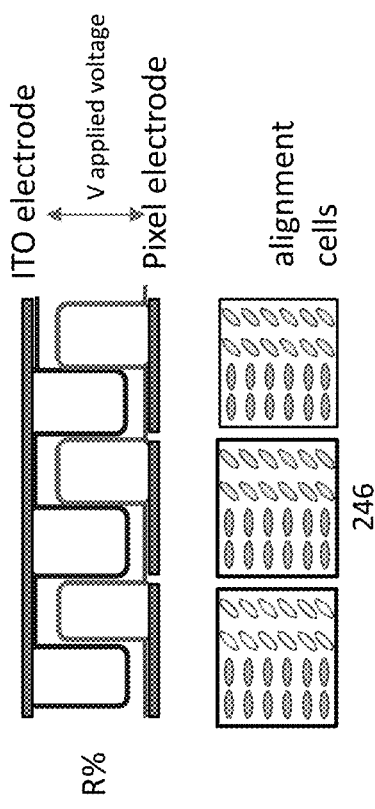
FIG. 2G shows exemplary alignment cells for the pixels of FIG. 2F, each or all can be turned, resulting in different reflectance (or transmittance in LCoS case) and phase curves as AM and PM that happen at the same time.

FIG. 2F shows two separate illustration curves 242 and 244, one being a reflectance curve 242 and the other being the phase curve. Under an appropriate electrode voltage (e.g., 0~2.5V, 0~5V or etc.), one half of a pixel 246 performs the AM by turning the corresponding LCs from black gradually to white or white gradually to black while the other half of the pixel 246 performs the PM by turning the corresponding LCs from 0 gradually to 2π or 2π gradually to 0. As shown in FIG. 2E, the ratio of AM and PM on a single pixel is not fixed at 50:50, but may be any numbers (e.g., 40:60 or 70:30). FIG. 2G shows the alignment cells for the pixel 246 of FIG. 2F is turned, resulting in different reflectance and phase curves, to achieve a different desired result.

FIG. 2H.1 and FIG. 2H.2 together show a simulation result on the single pixel 246 without involving the neighboring pixels. The simulation shows the liquid crystals 250 corresponding to the PM (left portion) are oriented differently from the liquid crystals corresponding to the AM (right portion) when the applied voltage is changing from 0V to 5V. It should be noted that the thickness or depth of the LC layer 250 is preferably twice as much as otherwise it is used for single modulation in one pixel. According to one embodiment, it is assumed that the depth of the LC layer 250 is great 2D, where D is the depth of an LC layer used for only AM or PM via one pixel or an array of pixels. In other words, slightly larger than this twice thickness to make sure a phase shift (0~2π) is achieved). The corresponding reflectance curve 252 and phase curve 254 are also presented with two voltages V1=0 and V2=5. The physical size of the pixel 246 is assumed that the pixel is 6.4 µm in width, thus approximately one half of 6.4 µm in width is dedicated for AM and the second half of 6.4 µm in width is dedicated for PM, if the ratio is kept to be 50:50.

Figure 2I:
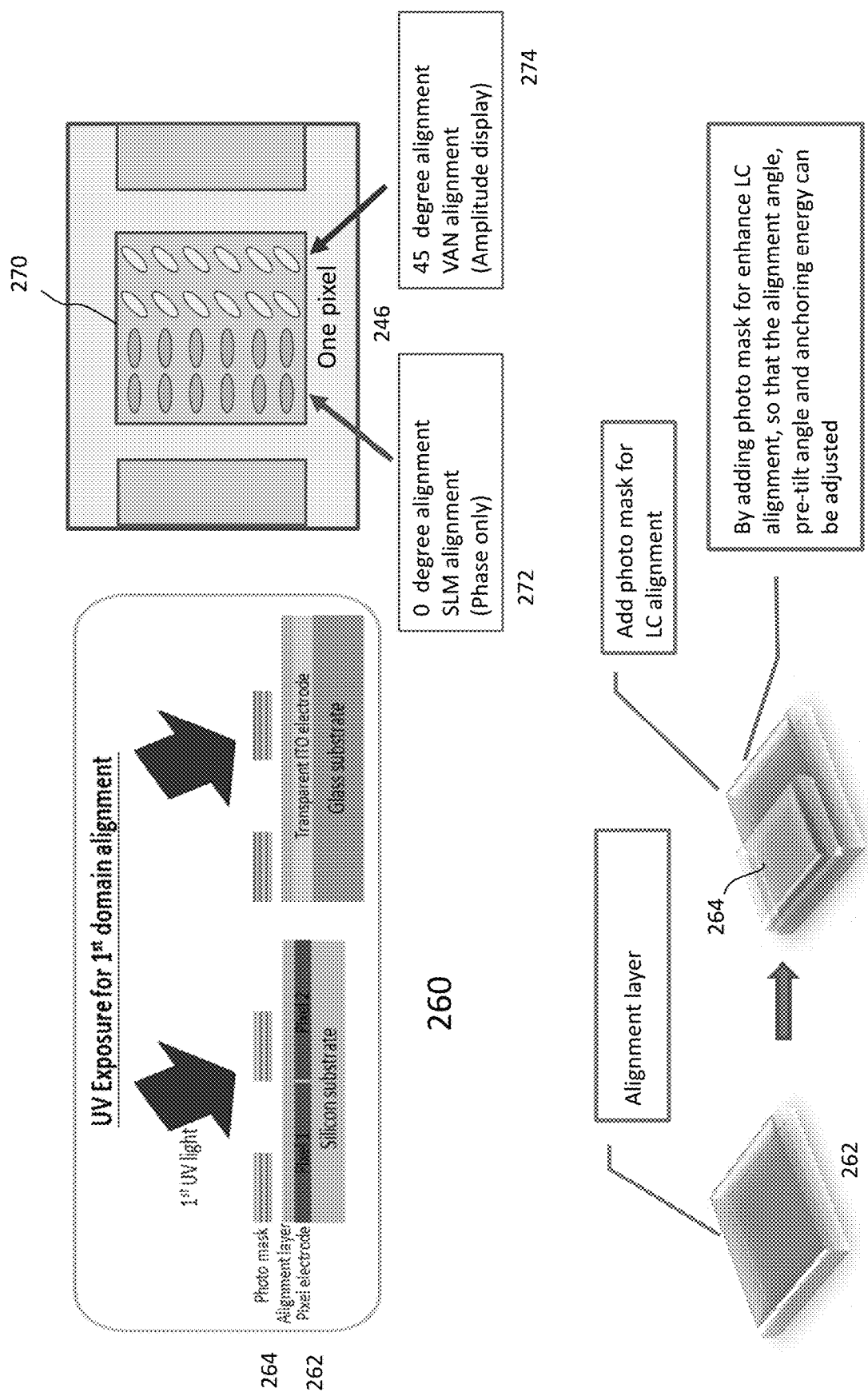
FIG. 2I shows an exemplary implementation of using a photo alignment mask method.

FIG. 2I shows an exemplary implementation 260 of using a photo alignment mask method. An alignment layer 262 is added thereon with a photo mask 264. Given a predefined pattern imprinted upon the photo mask 264, for example 50/50 for each cell, namely a cell 262 is configured to cause both of the AM and PM to take place simultaneously. The photo mask 264 is etched with UV lights or other means 268. As a result, a pixel is covered with an alignment cell 270 that has two different alignments, one 272 for the PM and the other 274 for the AM. The same pattern is etched for all the cells across the alignment layer in a single SLM device, as shown similarly in FIG. 2E. In an alternative embodiment (not shown in FIG. 2I), such an alignment cell, either horizontally aligned or diagonally aligned, covers just one pixel. All neighboring cells, each covering a single pixel, can be aligned differently. In other words, all the alignment cells are alternatively aligned either horizontally for the PM or diagonally for the AM, as shown similarly in FIG. 2D.

Figure 2J:
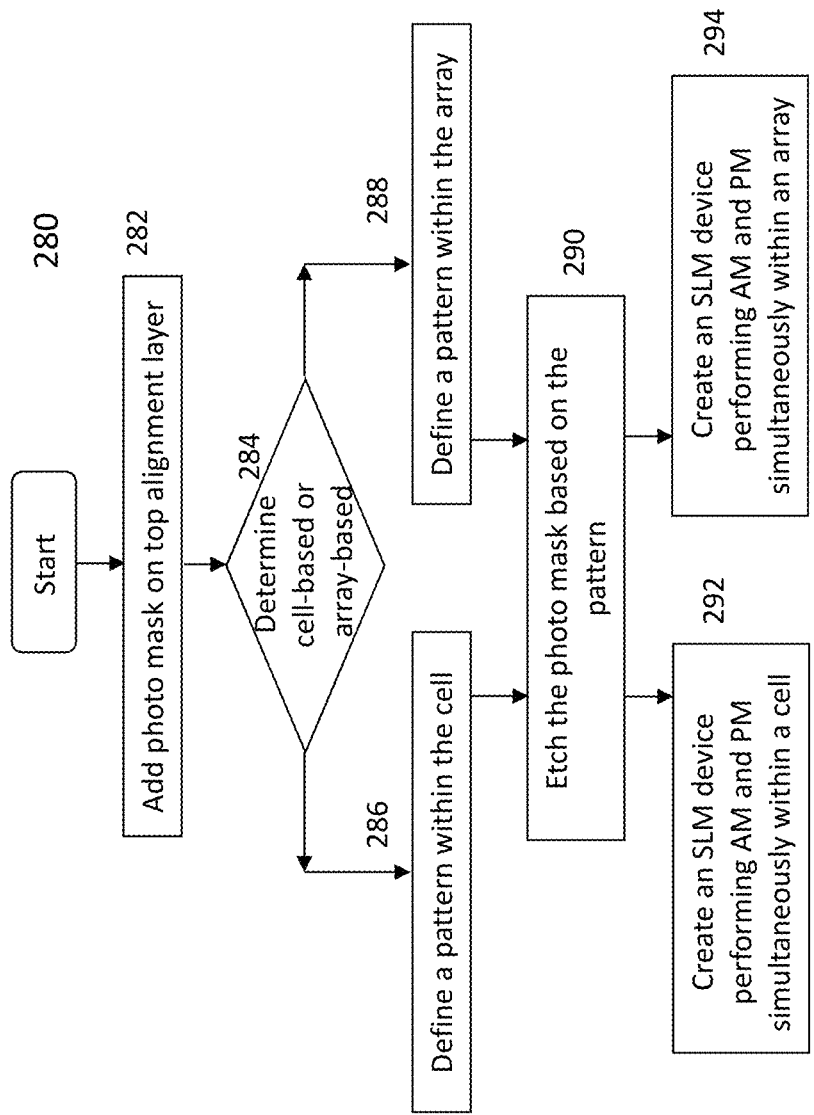
FIG. 2J shows a flowchart or process of creating an SLM device performing both AM and PM simultaneously within a cell or within an array according to one embodiment.

FIG. 2J shows a flowchart or process 280 of creating an SLM device performing both AM and PM simultaneously within a cell or within an array according to one embodiment. The process 280 may be better understood in conjunction with the figures above. The process 280 starts when an implementation of adding a photo mask on top of an alignment layer.

An SLM device, such as LCoS, includes an LC layer to control the pass of the reflected (or transmitted) light. As described above, one embodiment is to modify or add an alignment layer on top of the LC layer. Depending on the resolution of the SLM, there are a plurality of alignment cells, each responsible for a pixel. These cells need to be controlled uniquely to facilitate the LCs in the LC layer to modulate the reflected light in amplitude and phase, given the characteristics of the underlying LCs.

At 282, a photo mask is laid over the alignment layer. As described above with respect to FIGS. 2D and 2E, there are two ways to have the AM and PM occur at the same in a single SLM device, one being within a cell and the other within an array of cells. To facilitate the description of these two embodiments, the term "cell-based simultaneous modulations" indicates that the AM and PM are performed within a cell at the same time, namely an alignment cell is partitioned to have two parts, one for the AM and the other for the PM and the same is repeated across the entire array of cells in a single SLM device. The term "array-based simultaneous modulations" indicates that all the cells are alternatively designated to perform the AM or PM, namely no neighboring alignment cells performing the same modulations.

At 284, the process 280 determines how to design or configure the photo mask via print or lithography. If it is decided to have the cell-based simultaneous modulations, the process 280 goes to 286, where a corresponding pattern can be printed on the photo mask. According to one embodiment, all the cells shall have the same pattern across the array. According to another embodiment, all the cells in a row have the same pattern across the row while the neighboring rows have a half-pixel shift pattern in view of FIG. 2E, resulting in two alternating patterns across the rows. If it is decided to have the array-based simultaneous modulations, the process 280 goes to 288, where a corresponding pattern can be printed on the photo mask. The pattern dictates that every other cell is designated to perform one modulation (e.g., the AM) and every another cell is designated to perform another modulation (e.g., the PM). FIG. 2D shows an exemplary portion of such a pattern.

The pattern may be varying depending on what performance is being desired. In general, the ratio of the AM and PM within one cell is 50/50, but the ratio of the AM and the PM may be adjusted to any number if desired. Once the pattern is decided, the pattern may be imprinted onto the photo mask. The detail of making or imprinting a pattern onto a photo mask is not to be further described herein as it is well known in the art (e.g., in semiconductor manufacturing). The process 280 now goes to 290, where the photo mask is etched. There are many ways to etch a photo mask. Again, the detail of etching a photo mask is not to be further described herein as it is well known in the art (e.g., in semiconductor manufacturing). As a result of the alignment layer with the designated aligned cells, an SLM device performing the AM and the PM simultaneously within a cell is created at 292 or an SLM device performing the AM and the PM simultaneously within an array is created at 294.

Figure 3A:
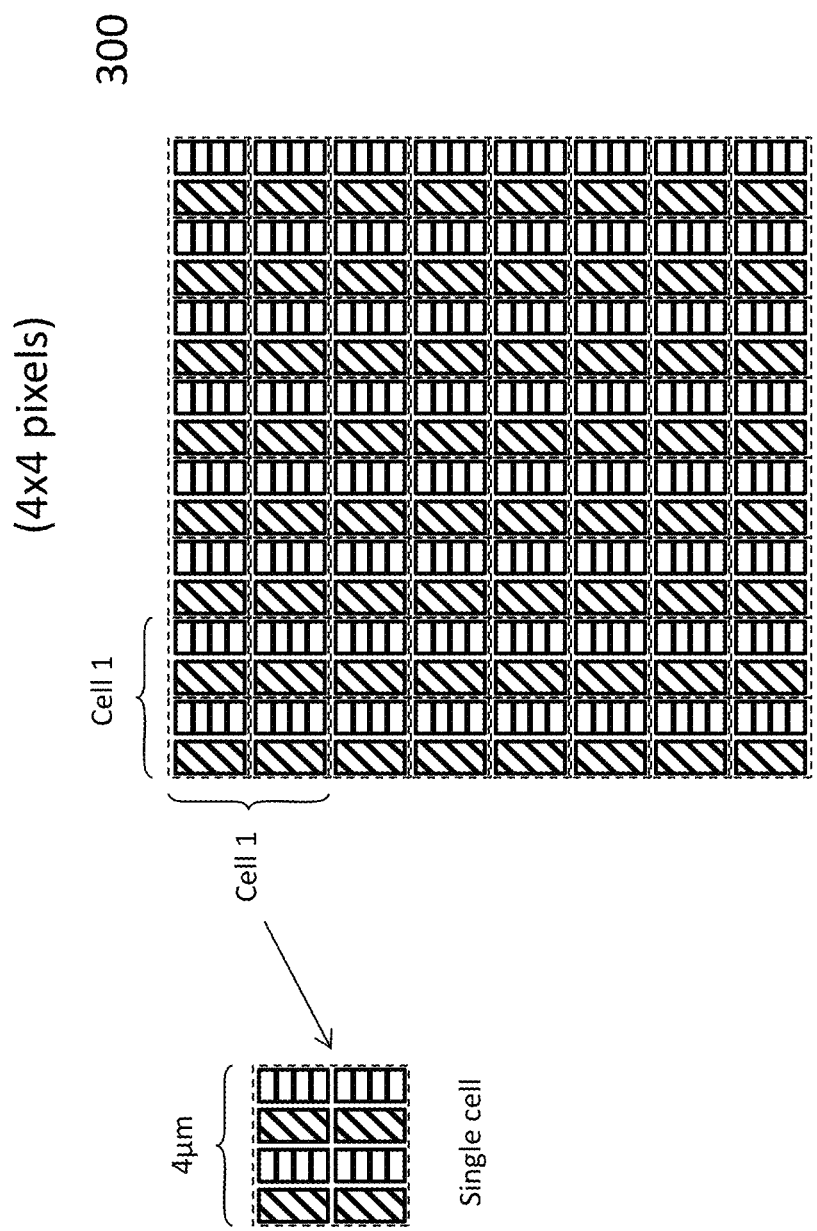
FIG. 3A shows how the LCs corresponding to a pixel perform quadruple AM and PM at the same time and increases the image resolution for holographic display in better quality.
Figure 3B:
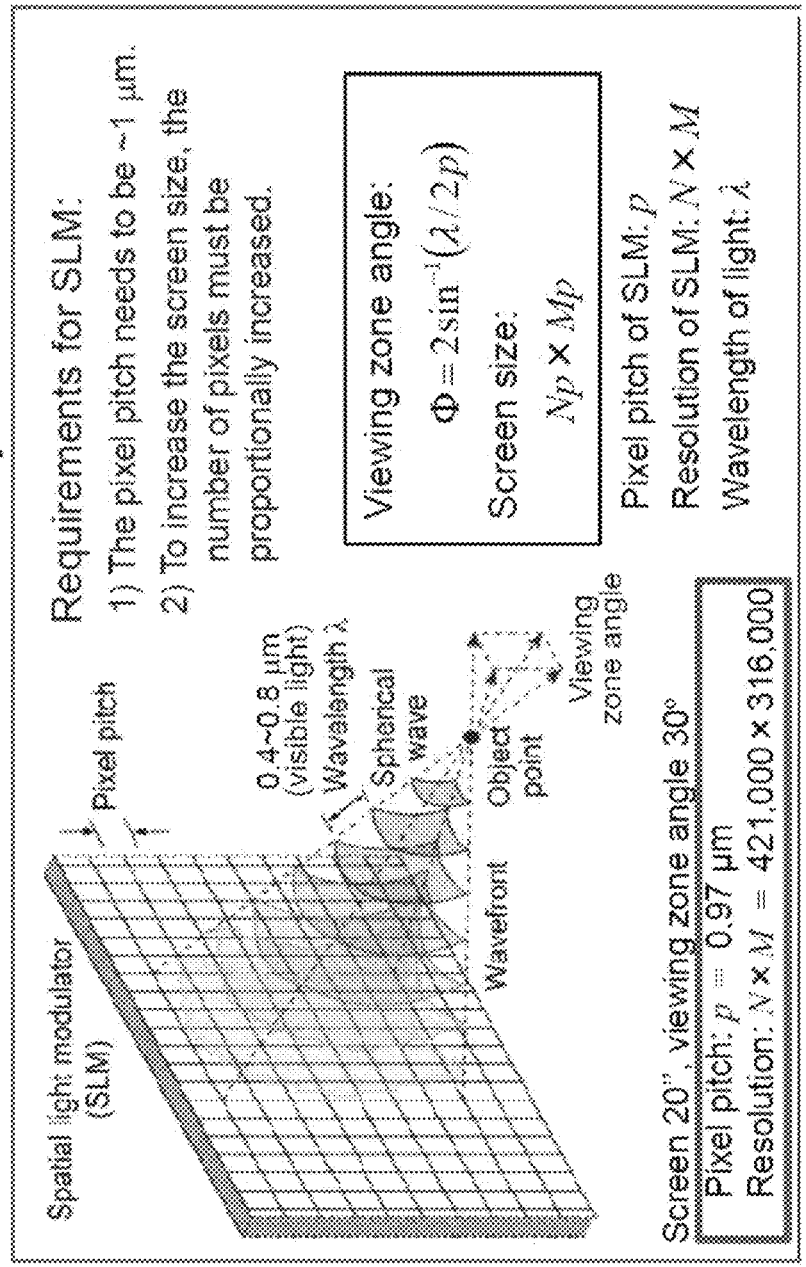
FIG. 3B shows that a pixel size has to be around 1 μm for a reasonable holographic display in 4K×2K or even as high as 421K×316K.

Referring now to FIG. 3A, it shows another embodiment 300 of the alignment cells, each of the cells is divided into four equal parts, each having its own alignment cell, where each cell causes both AM and PM to happen at the same time, resembling the concept of subpixels. As a result, a pixel could be perceived as if it is divided into four subpixels. If the width of the pixel is 4 µm, each of the subpixels would be approximately around 1 µm. As shown in FIG. 3B, the pixel size has to be around 1 µm for a reasonable holographic display in 4K×2K. With the original pixel size, it would be difficult to achieve such a reasonable resolution for a holographic display. With the present embodiment, as will be further described below, it is now possible to achieve the resolution with a specially designated mask. Those skilled in the art can appreciate that a mask can be readily modified to make these alignment cells with quadruple subcells given the description above.

Figure 3C:
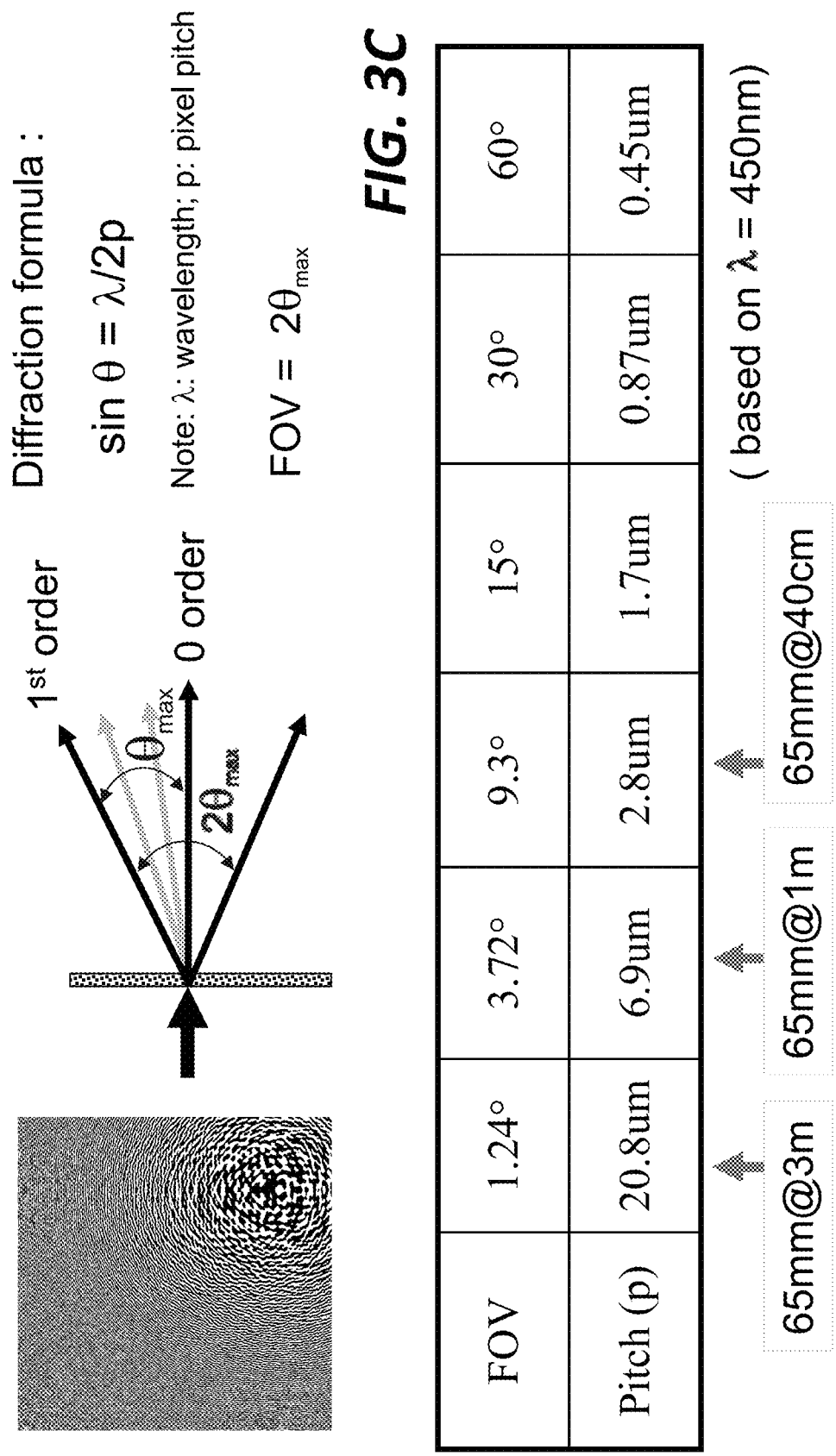
FIG. 3C shows different FOVs corresponding to different pitch sizes, given λ=450 nm.

One of the advantages, benefits and objectives using a smaller pixel size by the subcell concept via the photo mask is to provide a larger field of view (FOV). In a perspective, Bragg's law may be used to explain the result. It is well known that the diffraction formula is $\sin \phi = n\lambda/2p$, where n is a positive integer and $\lambda$ is the wavelength of the incident wave, p is a pitch size. $\phi$ would be increased when the pitch size p is reduced. Since FOV is approximated by $2\phi_{ax}$, a smaller pixel size will increase the FOV. FIG. 3C shows different FOVs corresponding to different pitch sizes, given $\lambda=450$ nm.

According to one embodiment which is also referred to as nano-imprinting lithograph (NIL), it includes two gratings: a shallow, short-pitch grating for liquid crystal alignment superimposed onto a deeper and a larger-pitch resonant grating. Both gratings are patterned onto a silicon nitride (SiN) thin-film layer. The two gratings are in parallel. Nematic liquid crystals are introduced on top of the superimposed gratings. The two indium tin oxide (ITO) layers serve as the low optical loss electrodes to apply an electric field across the liquid crystal cells.

Figures 4A, 4B:
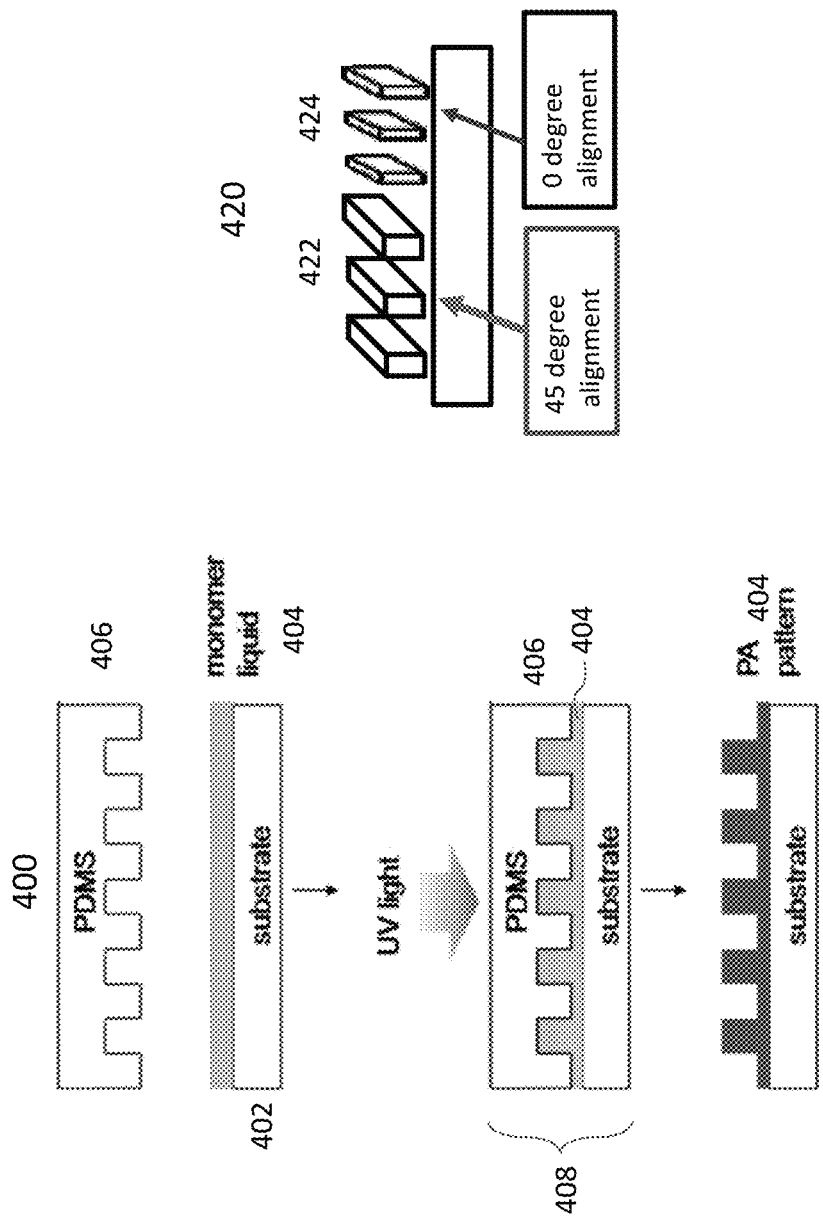
FIG. 4A illustrates how nano-imprinting lithograph (NIL) is used to implement one embodiment as a process to alter the characteristics of the liquid crystals used to module light in AM and PM.
FIG. 4B shows an exemplary tamp designed to form two different images, one for AM and the other for PM.

According to one embodiment, the acrylic used in sculpted gratings is formed by the reaction of a monomer liquid with a polymer powder. The monomers ("mono" meaning "one") contained in the liquid are microscopic chemical units which react together when mixed with chemicals in the powder. FIG. 4A illustrates how the NIL works in one embodiment as a process 400. A transparent substrate 402 is laid with a layer of monomer liquid 404. A stamp 406 is predesigned. In one embodiment, the stamp 406 is made from polydimethylsiloxane (PDMS), a silicone. It is patterned usually against a master to form a relief pattern used in soft lithography. The stamp 406 is pressed onto the monomer liquid 404. Under the UV treatment, as shown at 408, the monomer liquid 404 is shaped according to the image of the stamp 406, essentially an opposite image of the stamp 406.

Figure 4C:
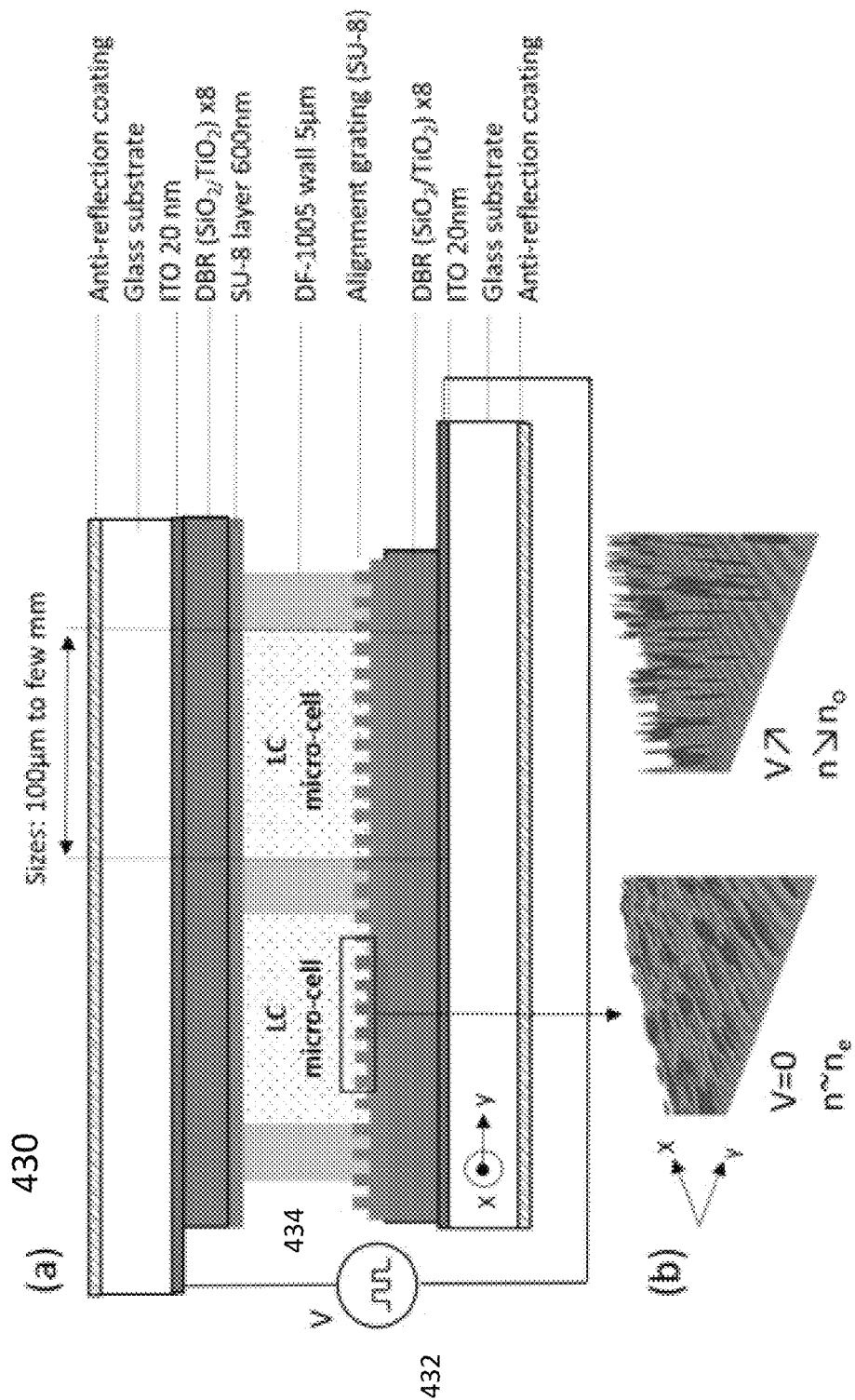
FIG. 4C shows a cross-section view of two pixels, each implemented with nano-imprinting lithography (NIL)
Figure 4D:
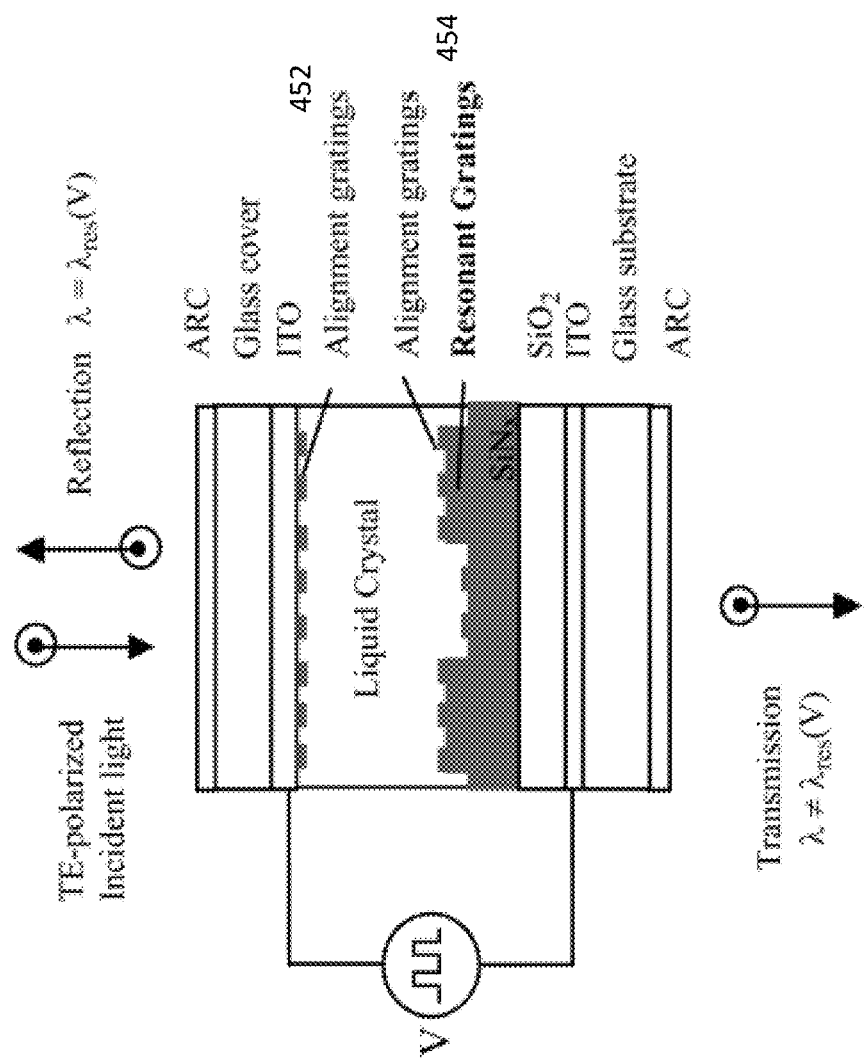
FIG. 4D shows an enlarged view of one pixel in which the gratings may be imprinted on both sides of the LC layer.

The same process 400 is applied to create two alignments for the AM and PM. As shown in FIG. 4B, a stamp (such as the stamp 406) is designed to form two different images. After applied to a layer of monomer liquid, two different alignment cells 422 and 424 are shaped out of the monomer liquid. FIG. 4C shows a cross-section view of two pixels, each implemented with the nano-imprinting lithograph (NIL). The monomer liquid 432 is so shaped that the liquid crystals 434 are twisted or orientated differently when a varying voltage is applied across each of the pixels. FIG. 4D shows an enlarged view of one pixel in which the two types of gratings may be imprinted on the both sides 452 and 454 of the LC layer 450.

According to another embodiment, a focused beam of electrons is used to draw custom shapes on a surface covered with an electron-sensitive film called a resist (exposing). The electron beam changes the solubility of the resist, enabling selective removal of either the exposed or non-exposed regions of the resist by immersing it in a solvent (developing). The purpose, as with photolithography, is to create embossed microstructures (specific alignment cells) to facilitate the modulations of both AM and PM in the liquid crystals.

Figure 5:
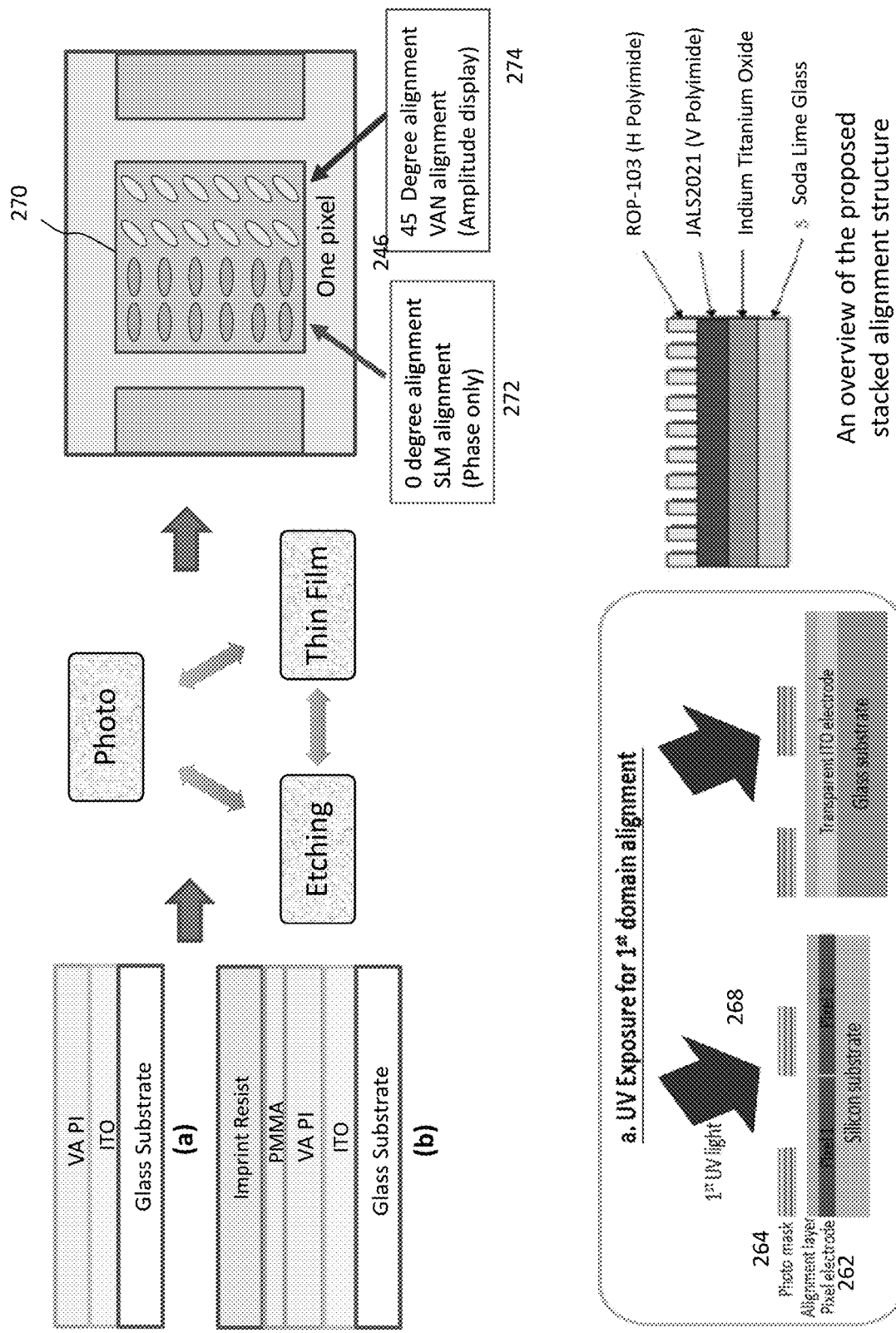
FIG. 5 summarizes some of the exemplary implementations.

FIG. 5 summarizes some of the exemplary implementations that use different materials. According to another embodiment that uses the characteristics of the liquid crystals under specific voltage control to perform the AM and PM. In this embodiment, the alignment layer 202 is not to be modified or laid with a photo mask. As shown in 2A, the liquid crystal layer 203 is positioned between a transparent electrode layer and a reflecting electrode layer, where the reflecting electrode layer would be replaced with a transparent electrode in the case of transmissive LCoS. The reflecting electrode comprises an array of pixel electrodes and is built on a silicon substrate or TFT substrate (such as HTPS). When a voltage difference is applied between the transparent electrode layer and one pixel electrode, LC molecules therebetween are re-orientated with an applied electric field.

Figure 6A:
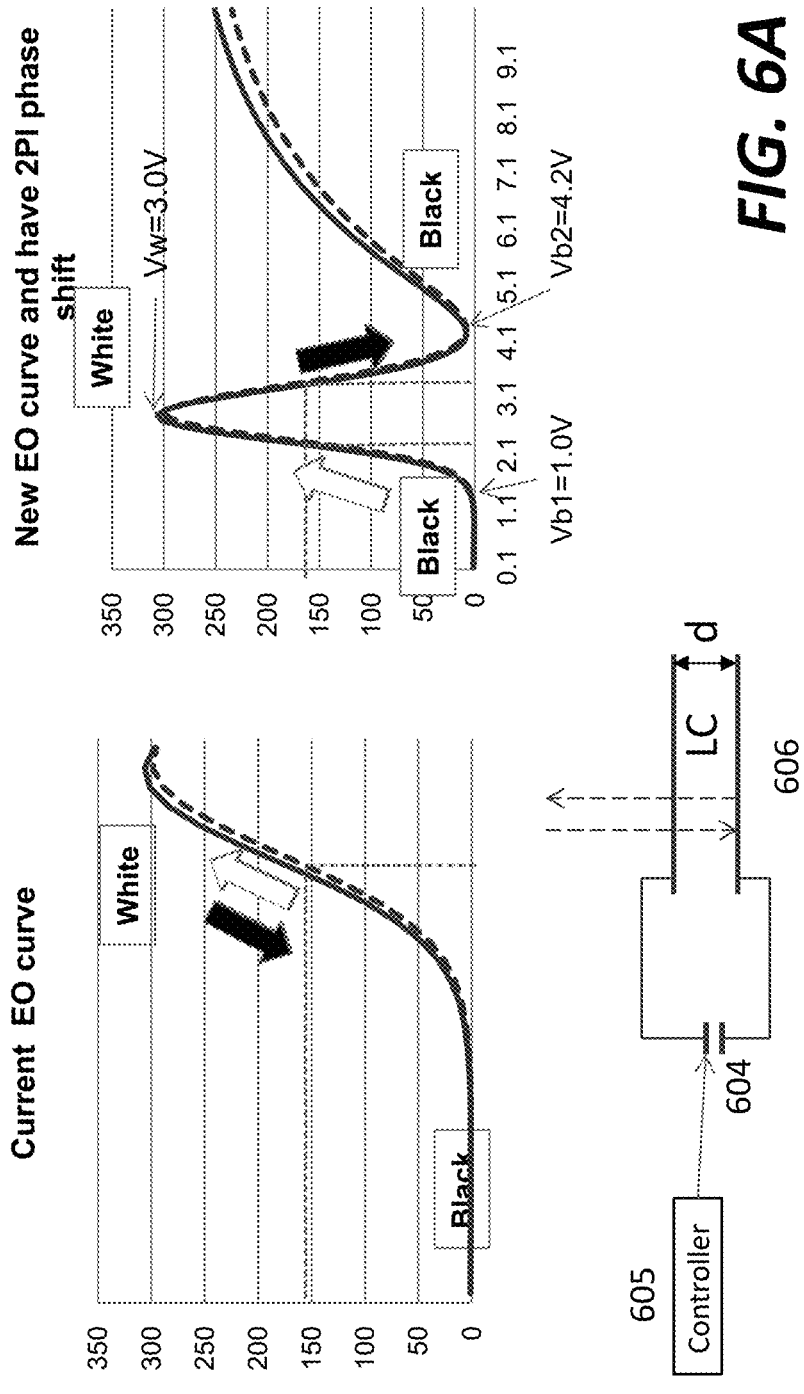
FIG. 6A shows an Electro-Optical (EO) curve based on a layer of liquid crystals commonly used in a prior art SLM device.

FIG. 6A.1 and FIG. 6B.2 together show an Electro-Optical (EO) curve 602 based on a layer of liquid crystals commonly used in a prior art SLM device. What the EO curve 602 shows is that a voltage applied across the layer of liquid crystal 606 goes up for white (completely turn-on) and then goes down for black (completely turn-off), which results in gray levels of images. In other words, when the voltage 604 moves low (VL or 0V) to high (VH or 2.5V), resulting in the corresponding changes of the applied electric field across the layer of liquid crystals, the light passing the liquid crystal 606 is increased. When the voltage 604 moves H to L, the light passing the liquid crystal 606 is decreased. According to one embodiment of the present invention, the voltage 604 is so controlled that it continues going up, causing the liquid crystals in the layer 606 to close gradually again even when the voltage exceeds H. In a perspective, there are two driving voltages, the liquid crystals in the layer 606 experience open and close, and then gradually open again as the voltage 604 continues going up. Under such a controlled voltage 604, the liquid crystals in the layer 606 provide a phase shift of at least 360 degrees or 2PI ($\pi$).

FIG. 6B shows an EO curve 612 and the phase curve 614 based on Equation (1) above and an EO curve 616 based on Equation (3) above. If $\delta$ is known as required phase retardation said $2\pi$, then the only parameters impacted the whole system function are limited to three parameters $\Delta n$, d, and $\lambda$. The "d", as cell gap of thickness of liquid crystal (LC) layer for light such R, G, and B to travel or propagate through and bounce light back returning total distance as 2d. The "$\Delta n$" as birefringence based on diffractive index on liquid crystal characteristics and the "$\lambda$" as wavelength of light wave such as red, green and blue in difference wavelength of light selected.

Figure 6C:
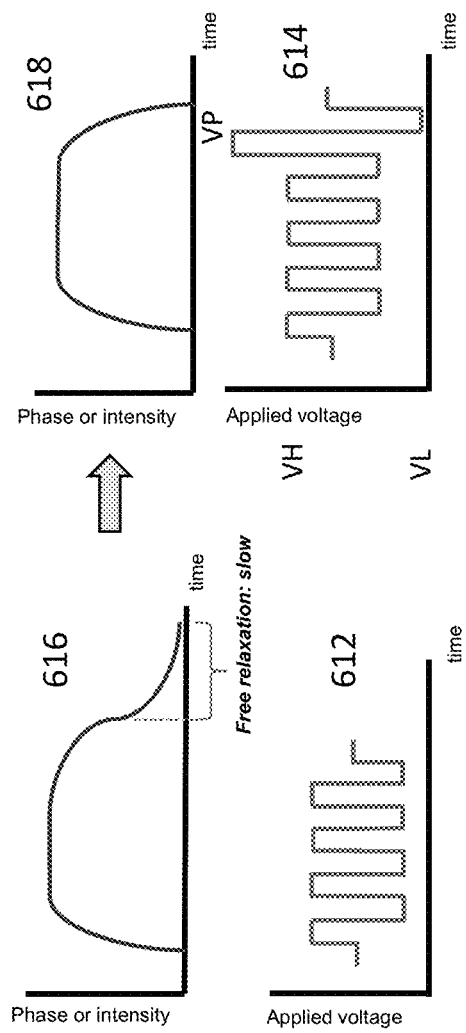
FIG. 6C shows two examples of applied voltages, where one voltage applied causes a free relaxation time after the voltage is released, and the other voltage has an impulsive higher volt near its end.

As a comparison, FIG. 6C shows two examples of applied voltages 612 and 614, where the voltage 612 applied causes a free relaxation time after the release of the voltage 612, as shown in the reflectance curve 614. According to one embodiment, the voltage source 604 is designed to generate a voltage 614. In other words, the voltage 614 is impulsively increased by a predefined level VP near its end. For example, VP is equal to 1.5 VH. The exact time may be determined based on the flash rate of a video signal. What shall be noted is the clock-type or step voltage 614 (between VL and VH) being applied across the liquid crystals. In operation, the lowest voltage VL is at least above Vth, a threshold voltage. VH is the voltage that causes to twist the liquid crystals. VP is greater than VH for a moment to minimize or eliminate the free relaxation time.

Figure 7B:
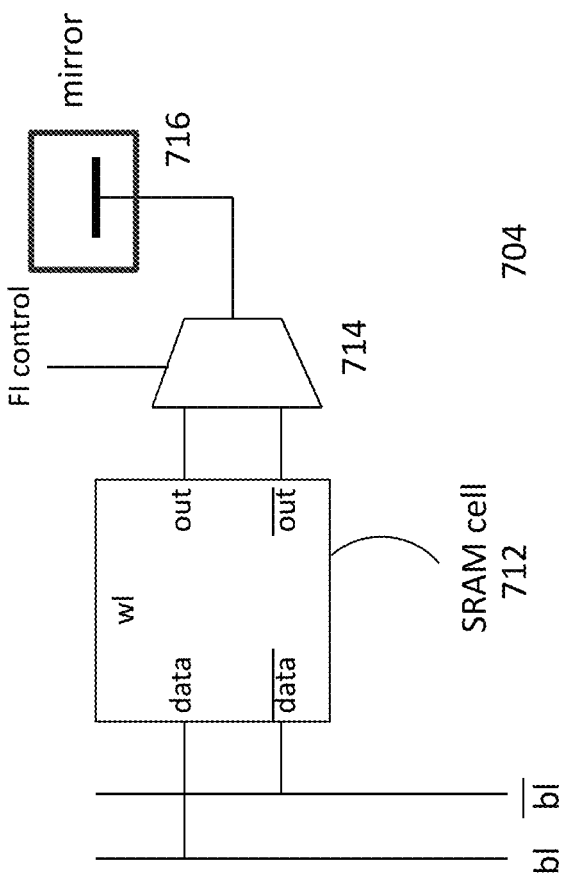
FIGS. 7A and 7B show respectively two functional diagrams for the analog driving method and digital driving method for SLM devices (e.g., LCoS panels)
Figure 7A:
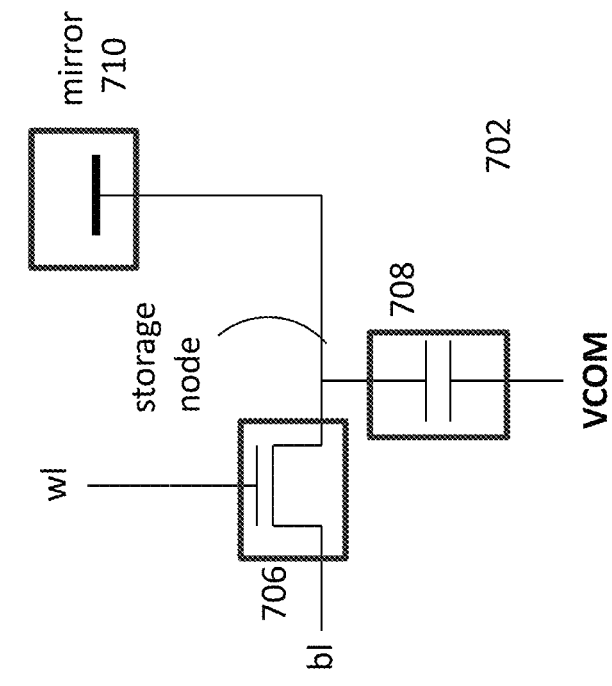

Now referring to FIG. 7A and FIG. 7B, which are duplicated from U.S. Pat. No. 10,147,350 which is hereby incorporated by reference. FIG. 7A and FIG. 7B show respectively two types of driving circuits to provide the voltage to drive the liquid crystals. As is the case in most memory cell architecture, image elements or pixels are best accessed via decoding a sequence of pre-determined address bits to specify the location of a target image element. These pre-determined address bits are further divided into X-address bits and Y-address bits. The X-address bits decode the location of control line (word line) of an image element while the Y-address bits decode the location of data line (bit line) of the image element. The set of circuits that decode the X-address bits into selected control lines (word lines) is called horizontal decoder or X-decoder. The set of circuits that decode Y-address bits into selected data lines (bit lines) is called vertical decoder or Y-decoder.

In general, there are two driving methods, analog and digital, to provide a gray level to a pixel, namely an image element or pixel in an array. As used herein, gray or a gray level implies a brightness or intensity level, not necessarily an achromatic gray level between black and white. For example, a red color is being displayed, in which case a gray level of the color means how much red (e.g., a brightness level in red) to be displayed. To facilitate the description of the present invention, the word gray will be used throughout the description herein. In the analog driving method, the gray level is determined by a voltage level stored in a storage node. In the digital driving method, the gray level is determined by a pulse width modulation (PWM), where the mixture of an ON state voltage duration and an OFF state voltage duration results in a gray level through the temporal filtering of human eyes.

There are two ways to feed video signals to the pixels in a spatial light modulator (e.g., an LCoS device): analog driving method and digital driving method . . . . Two functional diagrams 702 and 704 for the analog driving method and digital driving method are shown. For the analog driving scheme, one pixel includes a pass device 706 and one capacitor 708, with a storage node connected to a mirror circuit 710 to control a corresponding liquid crystal or a set of liquid crystals in a LC layer. For the digital driving method, pulse width modulation (PWM) is used to control the gray level of an image element. A static memory cell 712 (e.g., SRAM cell) is provided to store the logic "1" or logic "0" signal periodically. The logic "1" or logic "0" signal determines that the associated element transmits the light fully or absorbs the light completely, resulting in white and black. A various mixture of the logic "1" duration and the logic "0" duration decides a perceived gray level of the element. Via the gate 714, a mirror circuit 716 controls a corresponding liquid crystal or a set of liquid crystals in a LC layer.

Figure 8A:
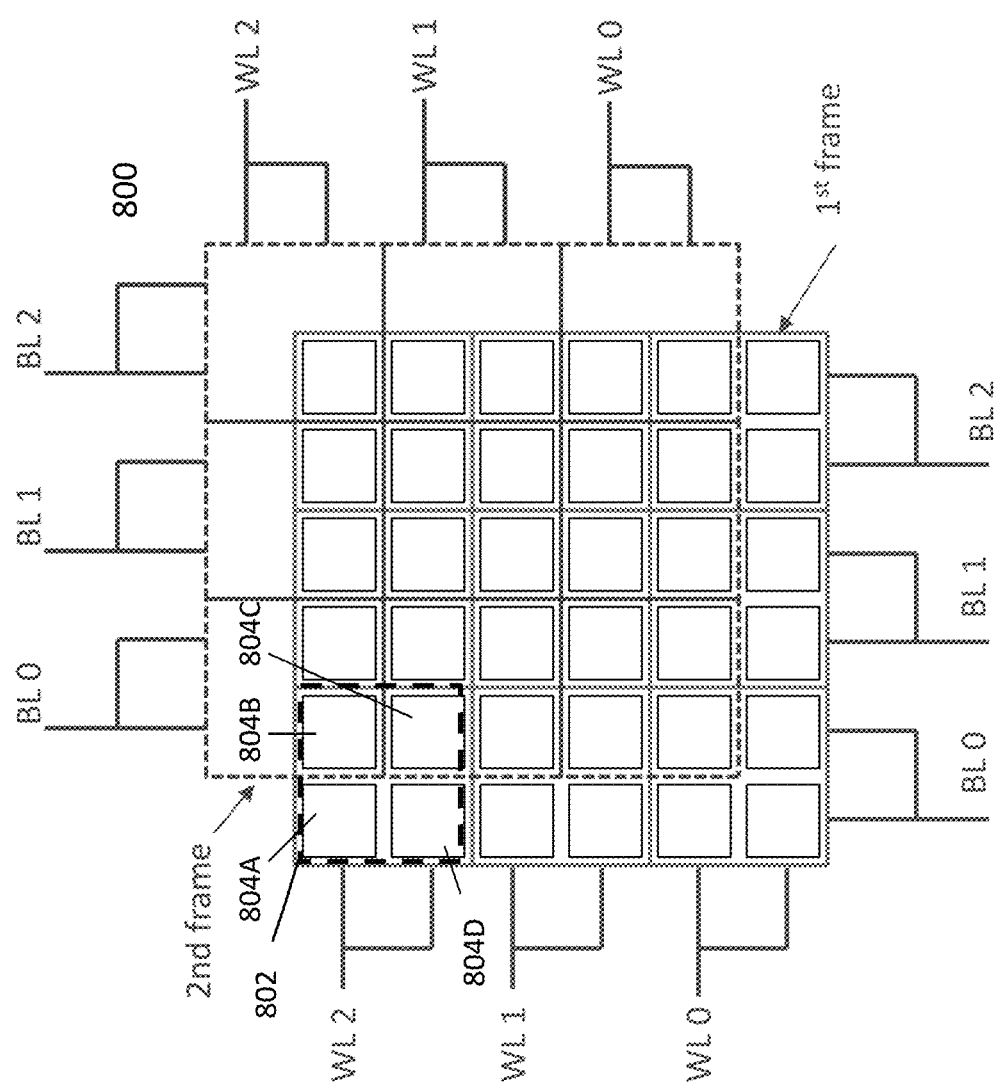
FIG. 8A shows a functional block diagram of an image element according to one embodiment of the present invention.
Figures 8B, 8C:
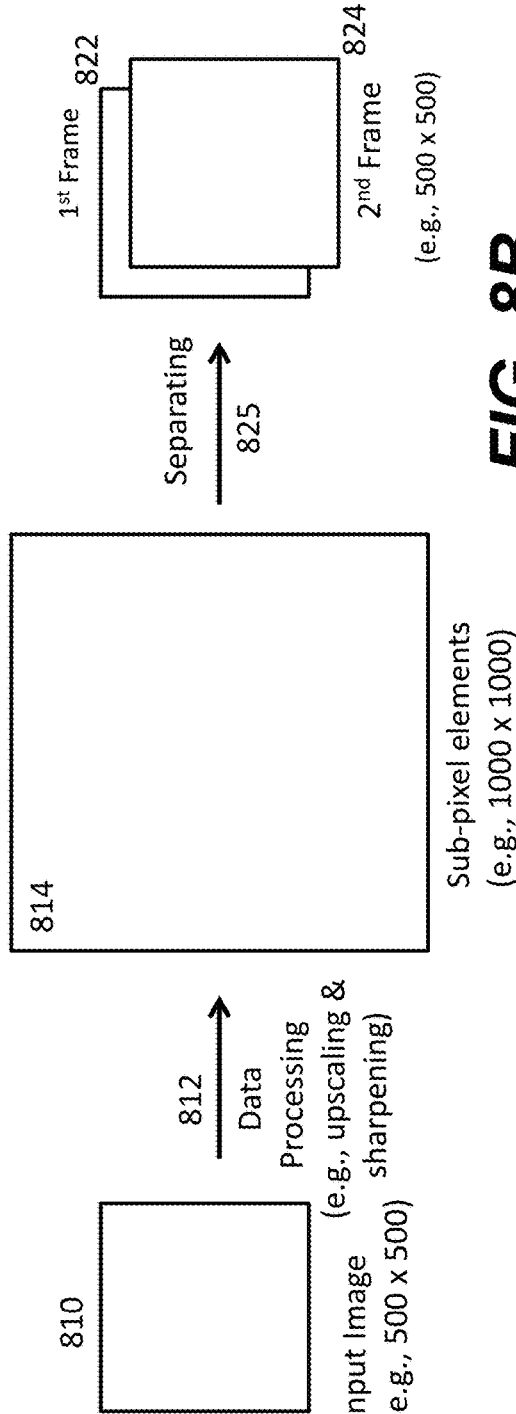
FIG. 8B and FIG. 8C are used to show how an input image is expanded to achieve the perceived resolution.

As described above, FIG. 3A shows how the LCs corresponding to a pixel perform quadruple AM and PM at the same time and increase the image resolution for holographic display in better quality. Referring now to FIG. 8A that is duplicated from U.S. Pat. No. 10,147,350, it shows a pixel 802 including four subpixels 804A-804D. It is now assumed that an input image of a first resolution (e.g., 500×500) is received and displayed in a second resolution (e.g., 1000× 1000) via the alignment cells shown in FIG. 3A, where the second resolution is twice as much as that the first resolution. According to one embodiment, the sub-pixel elements are shown to achieve the perceived resolution. It is important to note that such an improved spatial resolution is perceived by human eyes, not actually the doubled resolution of the input image. To facilitate the description of the present invention, FIG. 8B and FIG. 8C are used to show how an input image is expanded to achieve the perceived resolution.

It is assumed that an input image 810 is of 500×500 in resolution. Through a data process 812 (e.g., upscaling and sharpening), the input image 810 is expanded to reach an image 814 in dimension of 1000×1000. FIG. 8C shows an example of an image 816 expanded to an image 818 of double size in the sub-pixel elements. In operation, each of the pixels in the image 816 is written into a group of all (four) sub-pixel elements (e.g., the exemplary sub-pixel structure of 2×2). Those skilled in the art can appreciate that the description herein is readily applicable to other sub-pixel structures (3×3, 4×4 or 5×5, and etc), resulting in even more perceived resolution. According to one embodiment, a sharpening process (e.g., part of the data processing 812 of FIG. 8B) is applied to the expanded image 818 to essentially process the expanded image 818 (e.g., filtering, thinning or sharpening the edges in the images) for the purpose of generating two frames of images from the expanded image 818. In one embodiment, the value of each sub-pixel is algorithmically recalculated to better define the edges and produce the image 820. In another embodiment, values of neighboring pixels are referenced to sharpen an edge.

The processed image 820 is then separated into two images 822 and 824 by the separation process 825. Both 822 and 824 have a resolution same as that of the input image (e.g., 500×500), where the sub-pixel elements of images 822 and 824 are all written or stored with the same value. The boundaries of pixel elements in the image 822 are purposely to be different from the boundaries of pixel elements in the image 824. In one embodiment, the boundaries of pixel elements are offset by half-pixel (one sub-pixel in a 2×2 sub-pixel array) vertically and by half-pixel (one sub-pixel in a 2×2 sub-pixel array) horizontally. The separation process 825 is done in a way that, when overlapping images 822 and 824, the combined image can best match the image 820 of quadruple resolution of the input image 816. For the example in FIG. 8C, to keep the constant intensity of the input image 810, the separation process 825 also includes a process of reducing the intensity of each of the two images 822 and 824 by 50%. Operationally, the intensities in the first image are reduced by N percent, where N is an integer and ranged from 1 to 100, but practically is defined around 50. As a result, the intensities in the second image are reduced by (100−N) percent. These two images 822 and 824 are displayed alternatively at twice the refresh rate as that for the original input image 810. In other words, if the input image is displayed at 50 Hz per second, each of pixels in two images 822 and 824 are displayed 100 Hz per second. Due to the offset in pixel boundary and data process, viewers perceive the combined image close to the image 820. Offsetting the pixel boundary between images 822 and 824 has the effect of "shifting" pixel boundary. As illustrated as two images 826 and 828 according to another embodiment, the example in FIG. 8C is like shifting a (sub)pixel in southeast direction.

Depending on implementation, the separation process 825 may be performed based on an image algorithm or one-pixel shifting, wherein one-pixel shifting really means one sub-pixel in the sub-pixel structure as shown in FIG. 8A. There are many ways to separate an image of N×M across the intensity into two images, each of N×M, so that the perceived effect of displaying the two images alternatively at the twice refresh rate reaches the visual optimum. For example, one exemplary approach is to retain/modify the original image as a first frame with reduced intensity while producing the second frame with the remaining from the first frame, again with reduced intensity. Another exemplary approach is to shift one pixel (e.g., horizontally, vertically or diagonally) from the first frame (obtained from the original or an improved thereof) to produce the second frame, more details will be provided in the sequel. FIG. 8C shows that two images 822 and 824 are produced from the processed expanded image 820 per an image algorithm while two images 826 and 828 are generated by shifting the first frame on pixel diagonally to produce the second frame. It should be noted that the separation process herein means to separate an image across its intensities to produce two frames of equal size to the original image. FIG. 8D illustrates an image of two pixels, one being full intensity (shown as black) and the other one being one half of the full intensity (shown as grey). When the two pixel image is separated into two frames of equal size to the original, the first frame has two pixels, both being one half of the full intensity (shown as grey) and the second frame also has two pixels, one being one half of the full intensity (shown as grey) and the other being almost zero percent of the full intensity (shown as white). Now there are twice as many pixels as the original input image, displayed in a checkerboard pattern. Since each pixel is refreshed only 60 times per second, not 120, the pixels are half as bright, but because there are twice as many of them, the overall brightness of the image stays the same.

Figure 8E:
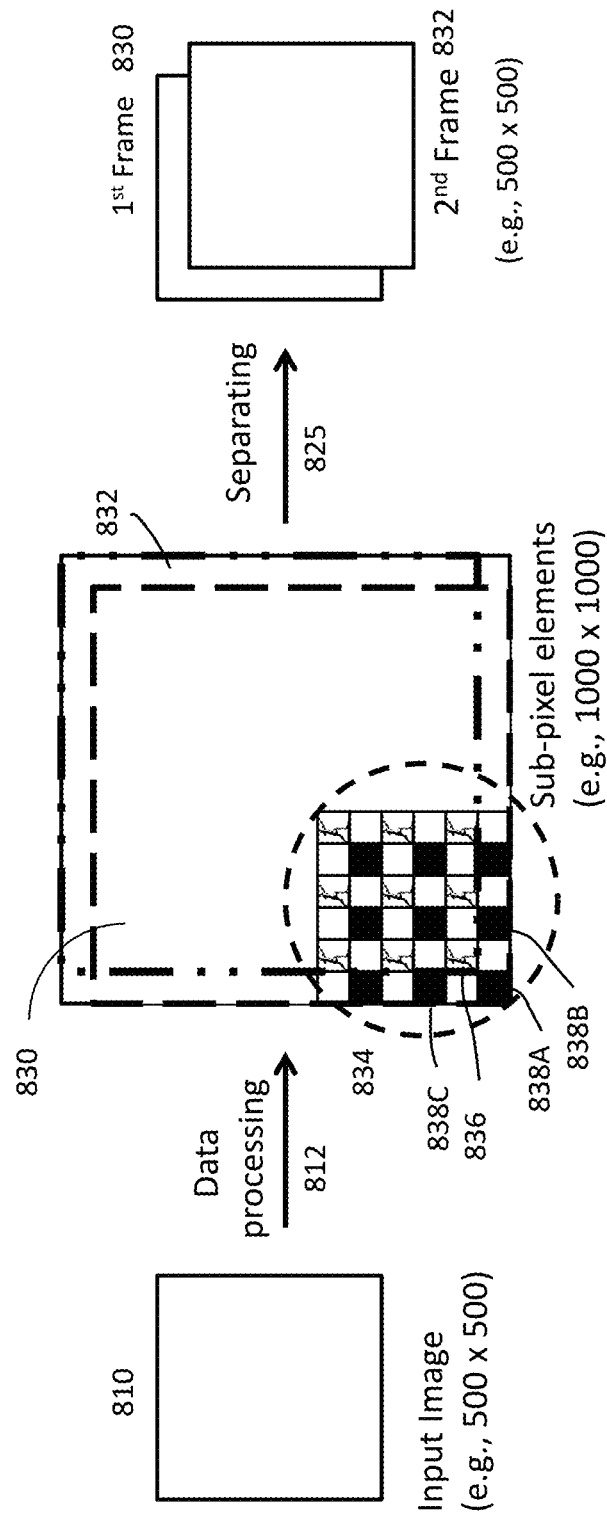
FIG. 8E, it shows another embodiment to expand an input image by controlling the intensities of the expanded two images.

Referring now to FIG. 8E, it shows another embodiment to expand an input image 810 by controlling the intensities of the expanded two images. It is still assumed that the input image 810 is of 500×500 in resolution. Through the data process 812, the input image 810 is expanded to reach a dimension of 1000×1000. It should be noted that 1000×1000 is not the resolution of the expanded image in this embodiment. The expanded image has two 500×500 decimated images 830 and 832. The expanded view 834 of the decimated images 830 and 832 shows that pixels in one image are decimated to allow the pixels of another image to be generated therebetween. According to one embodiment of the present invention, the first image is from the input image while the second image is derived from the first image. As shown in the expanded view 834 of FIG. 8E, an exemplary pixel 836 of the second image 832 is derived from three pixels 838A, 838B and 838C. The exemplary pixel 832 is generated to fill the gap among three pixels 838A, 838B and 838C. The same approach, namely shifting by one pixel, can be applied to generate all the pixels for the second image along a designated direction. At the end of the data processing 812, there is an interlaced image including two images 830 and 832, each is of 500×500. A separation process 825 is applied to the interlaced image to produce or restore therefrom two images 830 and 832.

Figure 8F:
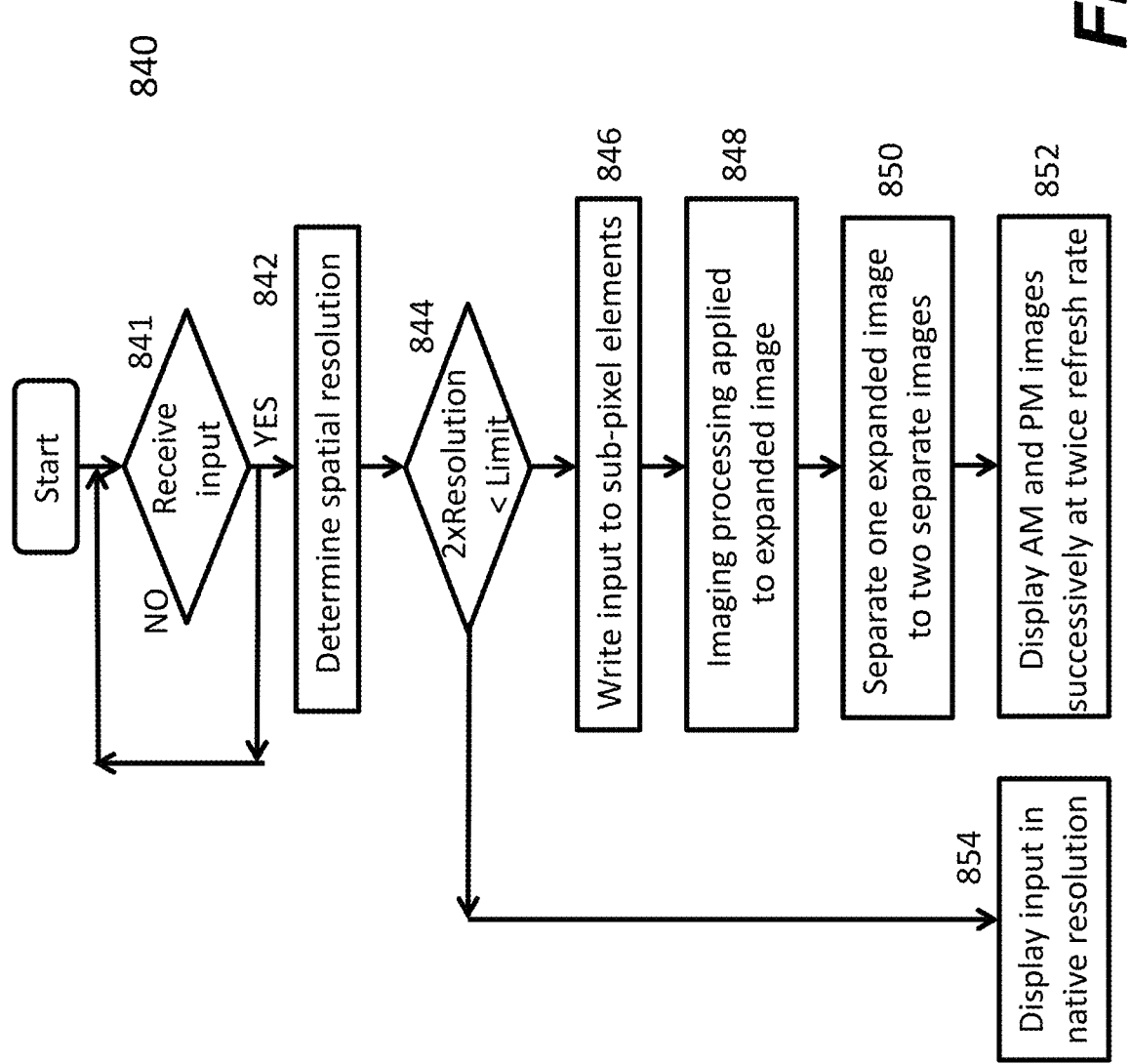
FIG. 8F shows a flowchart or process of generating two frames of image for display in an improved perceived resolution of an input image.

Referring now to FIG. 8F, it shows a flowchart or process 840 of generating two frames of image for display in an improved perceived resolution of an input image. The process 840 may be implemented in software, hardware or in combination of both, and can be better understood in conjunction with the previous drawings. The process 840 starts when an input image is received at 841.

The resolution of the input image is determined at 842. The resolution may be given, set or detected win the input image. In one case, the resolution of the input image is passed along. In another case, the resolution is given in a head file of the input image, where the head file is read first to obtain the resolution. In still another case, the resolution is set for a display device. In any case, the resolution is compared to a limit of a display device at 844, where the limit is defined to be the maximum resolution the display device can display according to one embodiment of the present invention.

It is assumed that the limit is greater than 2 times the resolution obtained at 842. That means a display device with the limit can "double" the resolution of the input image. In other words, the input image can be displayed in much improved perceived resolution than the original or obtained resolution. The process 840 moves to 846 where the pixels values are written into pixel elements, where each of the pixel elements has a group of sub-pixels. In operation, it is essentially an upscale process. At 848, applicable image processing is applied to the expanded image. Depending on implementation, exemplary image processing may include sharpening, edge detection, filtering and etc. The purpose of the image processing at this stage is to minimize errors that may have been introduced in the upscale operation when separating the expanded image into two frames. It should also be noted that the upscale process or the image processing may involve the generation of a second frame based on a first frame (the original or processed thereof) as illustrated in FIG. 8C. At the end of 848, an expanded image that has been processed applicably is obtained.

At 850, the expanded image is going under image separation to form two independent two frames. In connection with the description above, one of the two images is for the AM and the other of the two images is for the PM, all via the LC layer with the photo mask. As described above, there are ways to separate an image across the intensity into two frames of equal size to the image. In other words if the image is of M×N, each of the two frames is also of M×N, where only the intensity of the image is separated. Regardless of whatever an algorithm is used, the objective is to keep the same perceived intensity and minimize any artifacts in the perceived image when the two frames are alternatively displayed at the twice refresh rate (e.g., from 50 frames/sec to 100 frames/sec) at 852.

Back to 844, now it is assumed the limit is less than 2 times the resolution obtained at 842. That means a display device with the limit cannot "double" the resolution of the input image. In other words, it is practically meaningless to display an image in a resolution exceeding that of the display device unless some portions of the image are meant to be chopped off from display. The process 840 now goes to 854 to display the image in native resolution. One of the objectives, benefits and advantages in the present invention is the inherent mechanism to display images in their native resolutions while significantly improving the perceived resolution of an image when the native resolution is not of high.

It should be noted that the process 840 of FIG. 8F is based on one embodiment. Those skilled in the art can appreciate that not every block must be implemented as described to achieve what is being disclosed herein. It can also be appreciated that the process 840 can practically reduce the requirement for the memory capacity. According to one embodiment, instead of providing memory for storing two frames of image, only the memory for the first frame may be sufficient. The second frame may be calculated or determined in real time.

Figure 9A:
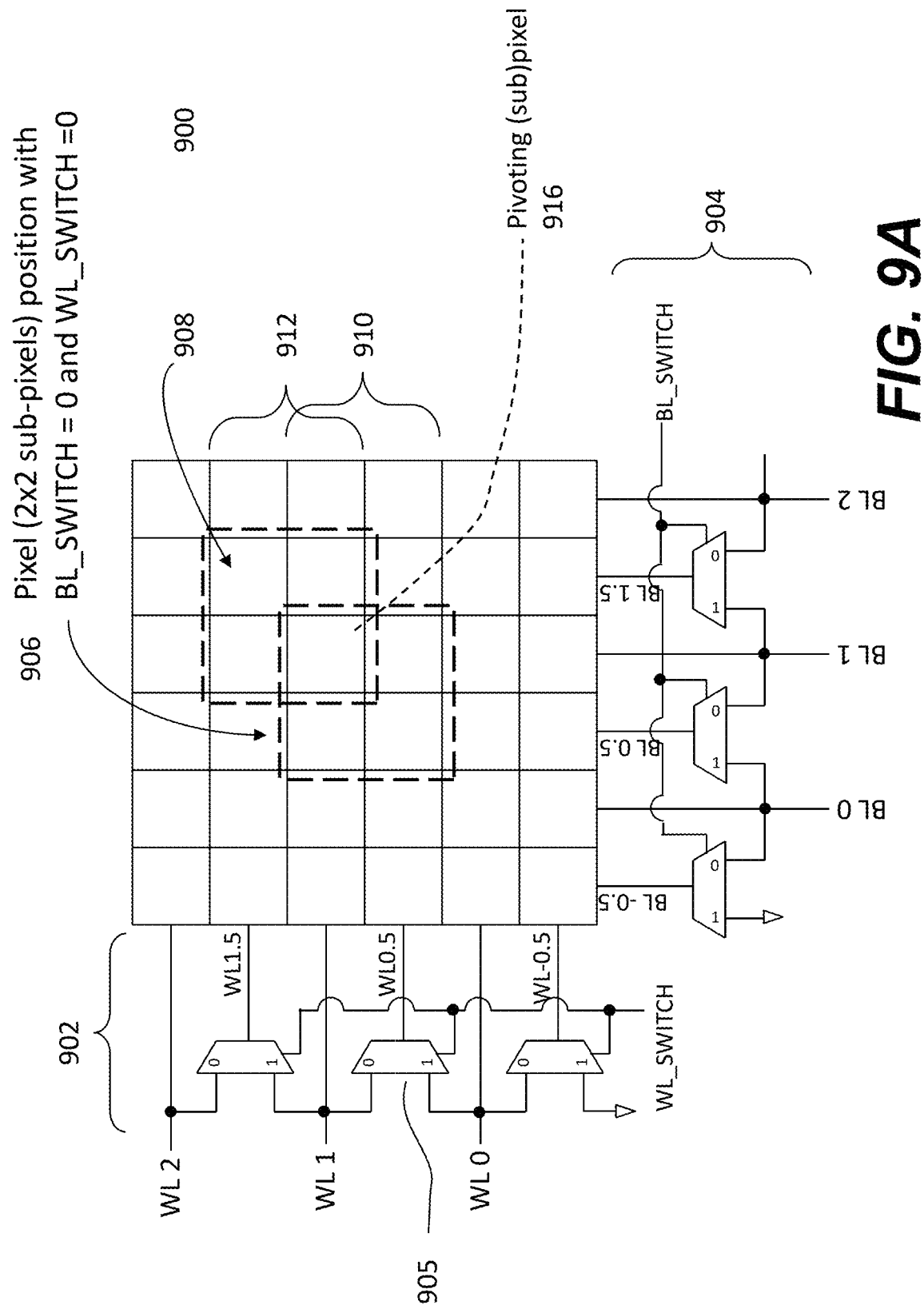
FIG. 9A shows an exemplary control circuit to address the sub-pixel elements.

Referring now to FIG. 9A, it shows an exemplary control circuit to address the sub-pixel elements 900. The set of circuits that decode the X-address bits into selected control lines (word lines) is called X-decoder 902. The set of circuits that decode Y-address bits into selected data lines (bit lines) is called Y-decoder 904. However, one of the differences between the prior-art decoder circuits and FIG. 9A is that the X-decoder 902 and Y-decoder 904 can address two lines at a time. For example, as shown in FIG. 9A, when both BL_SWITCH and WL_SWITCH are set to 0, a group of four sub-pixels 906 are selected by word line WL1 and data line BL 1. In another operation, when both BL_SWITCH and WL_SWITCH are set to 1, a group of four sub-pixels 908 are selected.

Figure 9B:
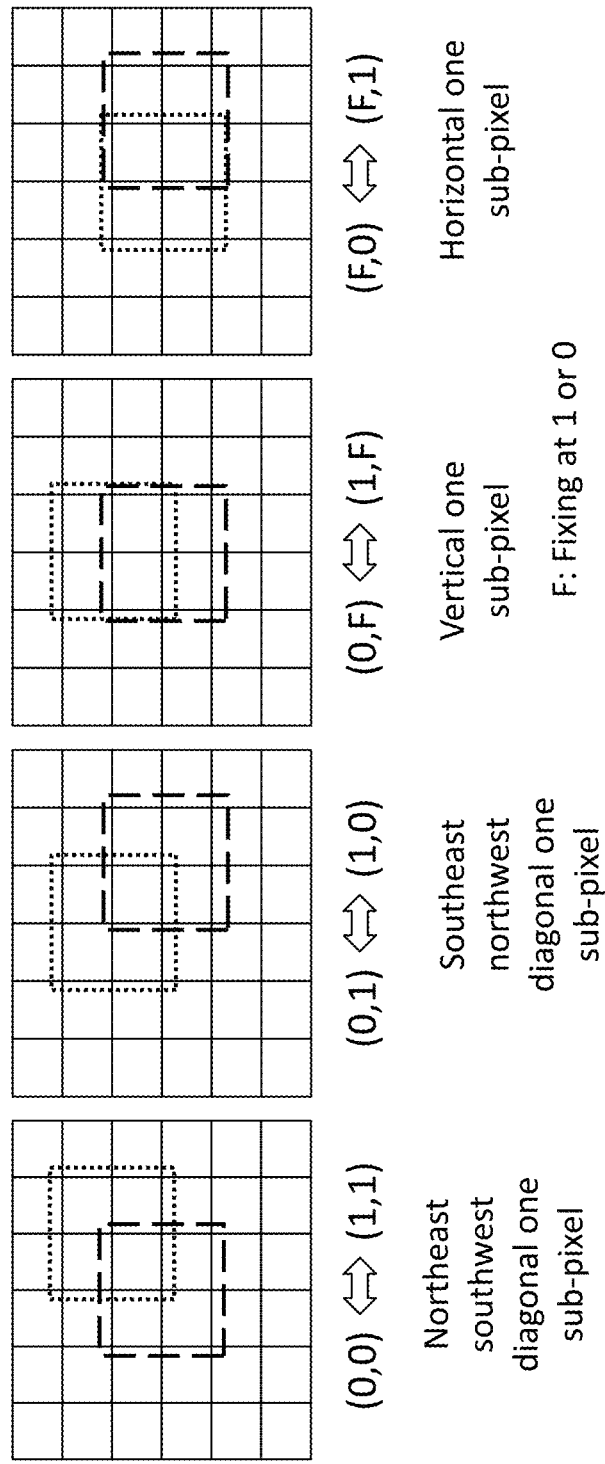
FIG. 9B shows some exemplary directions a pixel (including a group of sub-pixels) may be shifted by a sub-pixel in association with toggling control signals WL_SWITCH and BL_SWITCH.

As an example shown in FIG. 9A, each of the X-decoder 902 and Y-decoder 904 address two lines simultaneously by using a multiplexor or switch 905 to couple two switch signals WL1 and WL0, each of which is selected by a control signal WL_SWITCH. Controlled by the control signal WL_SWITCH being either 1 or 0, two neighboring lines 910 or 912 are simultaneously addressed by the X-decoder 902. The same is true for the Y-decoder 904. As a result, the sub-pixel elements 906 and the sub-pixel elements 906 are respectively selected when WL_SWITCH is switched from 0 to 1 and at the same time BL_SWITCH is switched from 0 to 1. In a perspective, the sub-pixel group 906 is moved diagonally (along the northeast or NE) by one sub-pixel to the sub-pixel group 908. FIG. 9B shows some exemplary directions a pixel (including a group of sub-pixels) may be shifted by a sub-pixel in association with toggling control signals WL_SWITCH and BL_SWITCH.

Referring back to FIG. 9A, as each time, the sub-pixel group 906 or the sub-pixel group 908 is shifted by one-half sub-pixel group or one sub-pixel, it can be observed that one sub-pixel is fixed or always addressed when WL_SWITCH is switched from 0 to 1 or 1 to 0 and BL_SWITCH is switched from 0 to 1 or 1 to 0. This fixed sub-pixel is referred to herein as a pivoting (sub)pixel, essentially one of the sub-pixels in a sub-pixel group or pixel element. As will be further described below, circuitry facilitating to implement one of the embodiments in the present invention can be significantly simplified, resulting in less components, smaller die size and lower cost.

Figure 10A:
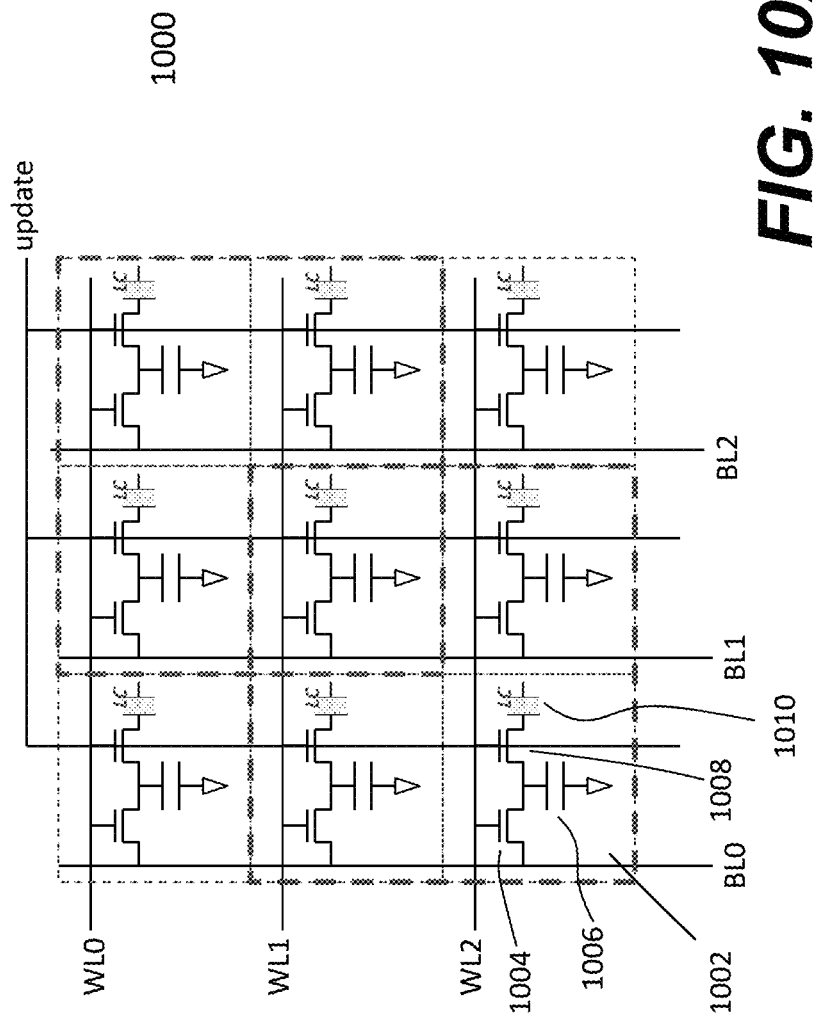
FIG. 10A shows a circuit implementing the pixels or pixel elements with analog sub-pixels.
Figures 10B, 10C:
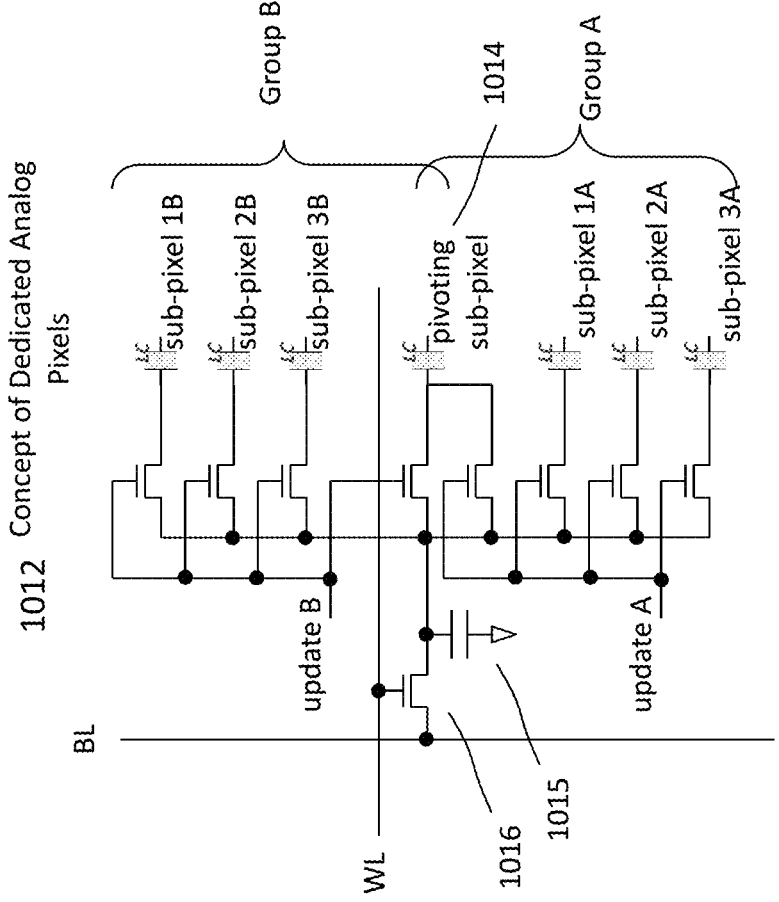
FIG. 10B shows two pixel elements A and B each including four sub-pixels, where one sub-pixel is the pivoting pixel 1014 shared in each of the two pixel elements A and B.
FIG. 10C shows a simplified circuit from the circuit of FIG. 10A according to one embodiment of the present invention.

Referring now to FIG. 10A, it shows a circuit 1800 implementing the pixels or pixel elements with analog sub-pixels. Each of the sub-pixels is based on an analog cell. Similar to FIG. 7A, an analog cell 1002 includes a pass device 1004 and one capacitor 1006 to store a charge for the sub-pixel. A pass device 1008 is provided to transfer the charge on the capacitor 1006 to the mirror plate of liquid crystal 1010, which may also serve as a capacitor. Instead of using identical analog cells as sub-pixels, the circuitry by utilizing the shared pivoting pixel of two shift positions can be further simplified. FIG. 10B shows two pixel elements A and B each including four sub-pixels, where one sub-pixel is the pivoting pixel 1014 shared in each of the two pixel elements A and B. It can be observed that the pivoting pixel needs to be updated by either one of the two pixel elements A and B, and is always selected. As a result, the circuit 1000 of FIG. 10A can be simplified to a circuit 1018 of FIG. 10C according to one embodiment of the present invention. The circuit 1018 of FIG. 10C shows that three non-pivoting cells 1A, 2A and 3A in the pixel element A are updated in accordance with the update signal A while three non-pivoting cells 1B, 2B, and 3B in the pixel element B as well as the pivoting cell are updated in accordance with the update signal B.

As further shown in FIG. 10A, there is only one capacitor 1015 to serve as the storage element and one pass gate 1016 to connect the data line to capacitor 1015 within the two pixel elements A and B. Therefore, only one word line and only one data line is needed to address the storage element 1015. Shifting is performed through switching between the control signals update A and update B. When update A is 1, the video signal stored in capacitor 1015 is passed to all sub-pixels in pixel group A, including sub-pixel 1A, 2A, 3A, and the pivoting (sub)pixel 1014. When update B is 1, the video signal stored in capacitor 1015 is passed to all sub-pixels in pixel group B, including sub-pixel 1B, 2B, 3B, and the pivoting (sub)pixel 1014.

It can be observed that the pivoting pixel 1014 needs to be updated by either one of the two pixel elements A and B, and is always selected. As a result, the circuit 1000 of FIG. 10A can be simplified as only one capacitor 1015, one pass gate 1016, one word line, and one data line are needed to implement the sub-pixel shifting. Compared to the circuit 1000 of FIG. 10A, the circuit of FIG. 10B can result in smaller area for circuitry as less components, word lines and data lines are needed. The circuit 1018 of FIG. 10C shows the physical implementation of the circuit described in FIG. 10B according to one embodiment of the present invention. The circuit 1018 of FIG. 10C shows that three non-pivoting cells 1A, 2A and 3A in the pixel element A are updated in accordance with the update signal A while three non-pivoting cells 1B, 2B, and 3B in the pixel element B as well as the pivoting cell are updated in accordance with the update signal B. The pass gate and the capacitor are associated to the pivoting sub-pixel for ease of illustration. In reality, they can be placed anywhere inside the pixel group A and pixel group B boundary. For all non-pivoting sub-pixel cells, 1A, 2A, 3A, 1B, 2B, and 3B, they are shared with neighboring pixel A and pixel B cells. Neighboring pass gates coupled with update A and update B are shown in dotted lines in FIG. 10C.

Figures 11A, 11B:
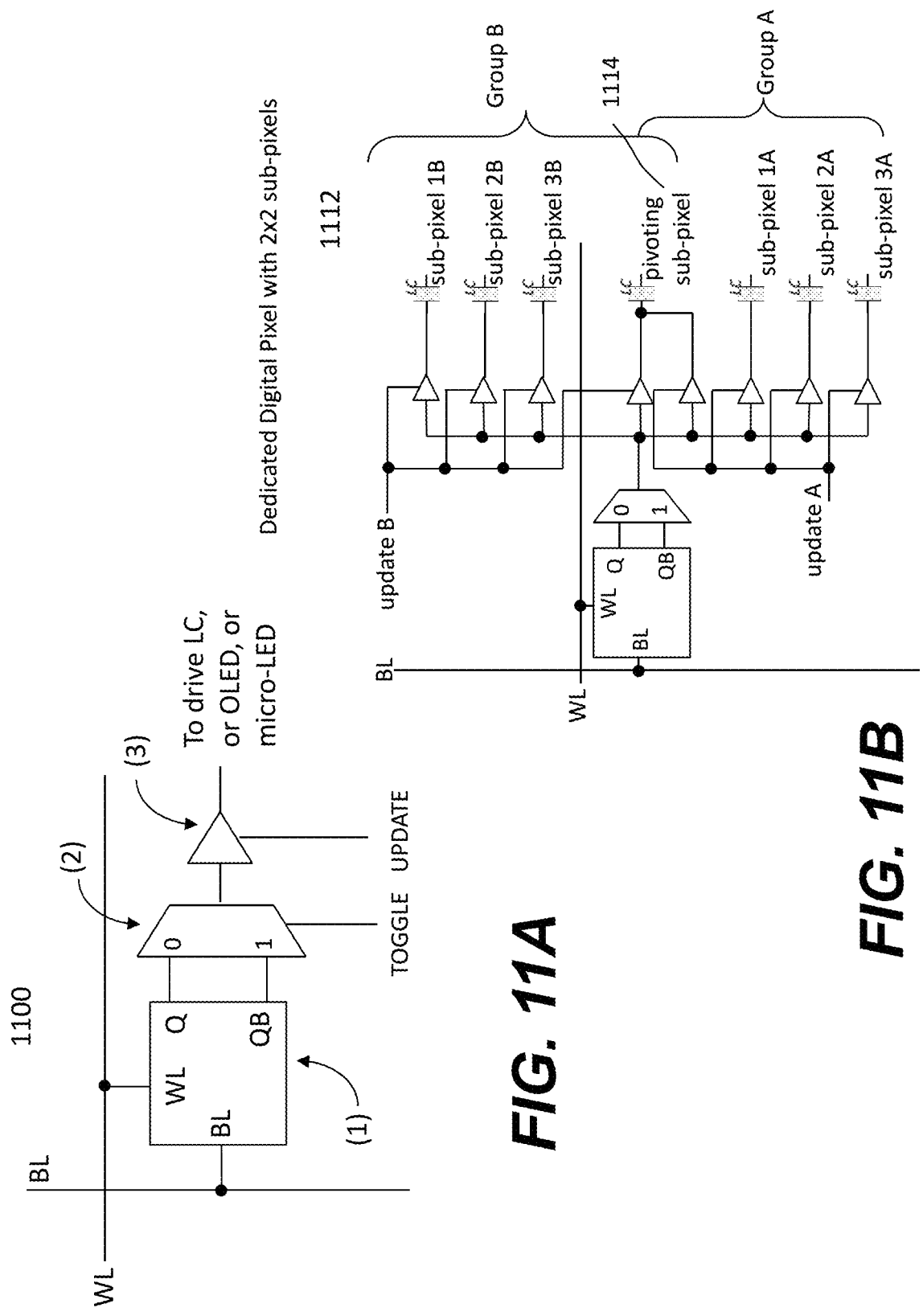
FIG. 11A shows a circuit implementing the pixels or pixel elements with digital sub-pixels, each of the sub-pixels is based on a digital memory cell (e.g., SRAM)
FIG. 11B shows a concept of sharing the pivoting sub-pixel in two pixel elements.
Figure 11C:
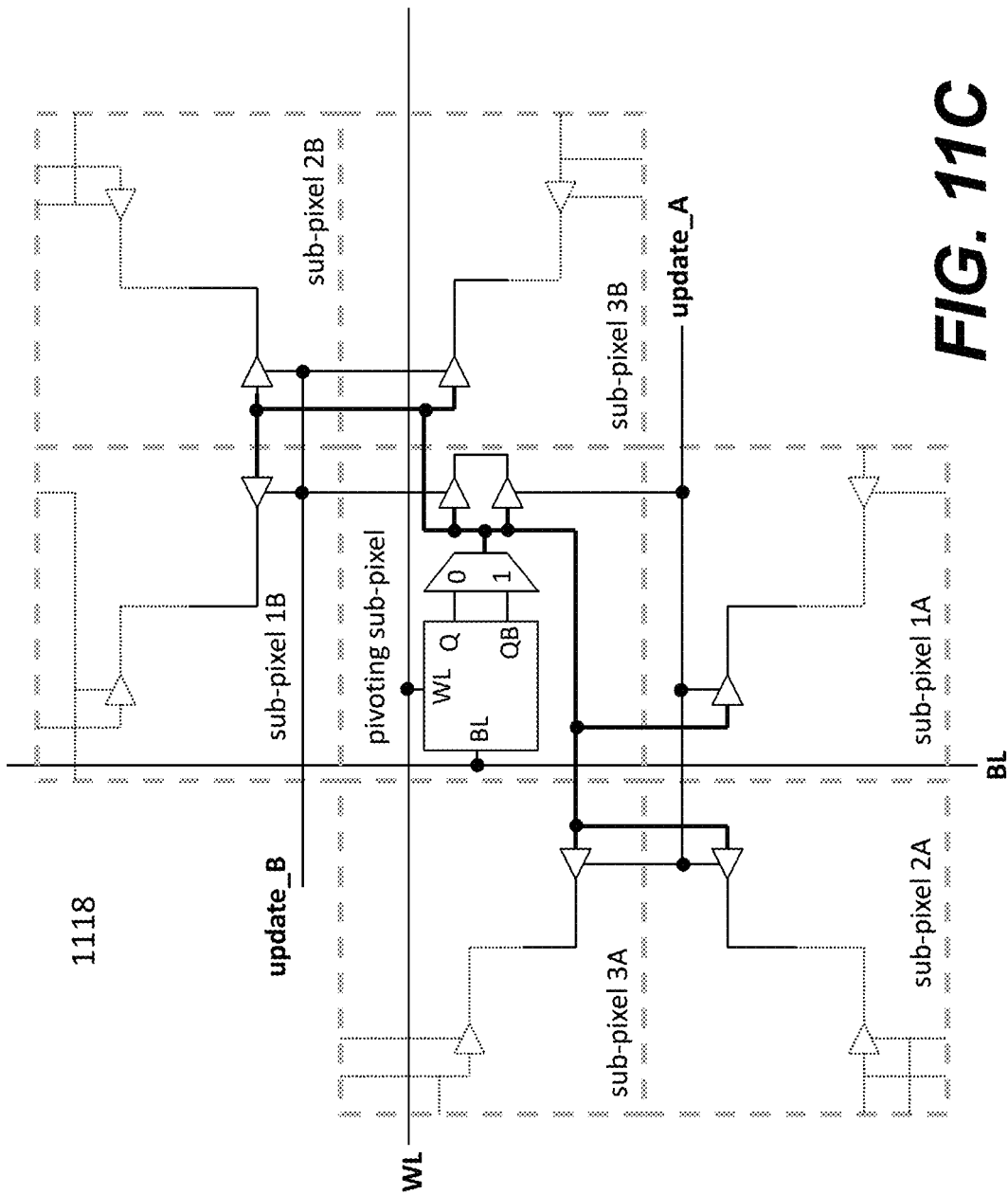
FIG. 11C shows an exemplary circuit simplified from, the circuit of FIG. 19A based on the concept of pivoting pixel.

FIG. 11A shows a digital version of a sub-pixel 1100. In one embodiment, pulse width modulation (PWM) is used to control the gray level of an image element. Similar to FIG. 7B, a static memory cell 1102 (e.g., SRAM cell) is provided to store a logic value "1" or "0" periodically. The logic value "1" or "0" signal determines that the associated element 1100 transmits the light fully or absorbs the light completely, resulting in white or black. A various mixture of the logic "1" duration and the logic "0" duration decides a perceived gray level of the element 1100. FIG. 11B shows the concept of using the pivoting sub-pixel. The circuit 1112 in FIG. 11B shows two pixel elements A and B each including four sub-pixels, where one sub-pixel is the pivoting pixel 1114 shared in each of the two pixel elements A and B. It can be observed that the pivoting (sub)pixel 1114 needs to be updated by either one of the two pixel elements A and B, and is always selected. As a result, the circuit 1100 of FIG. 11A can be simplified to a circuit 1112 of FIG. 11B according to one embodiment of the present invention. The circuit 1118 of FIG. 11C is a alternative representation of the circuitry shown in FIG. 11B. The circuit 1118 of FIG. 11C shows that three non-pivoting cells 1A, 2A and 3A in the pixel element A are updated in accordance with the update signal A while three non-pivoting cells 1B, 2B, and 3B in the pixel element B as well as the pivoting cell are updated in accordance with the update signal B.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

We claim:

1. A spatial light modulator comprising:
   alignment layer including at least a first layer of optical grating formed into a plurality of first cells to control amplitude modulation (AM) on incoming light and a plurality of second cells to control phase modulation (PM) on the incoming light, the first and second cells interlacing across the alignment layer, wherein the optical grating in the first and second cells are in two different geometries, each causing the incoming light to be modulated in amplitude and phase;
   a reflecting electrode layer comprising an array of pixel electrodes, each controlling a pixel; and
   a layer of liquid crystals, with a predefined thickness, sandwiched between the alignment layer and the reflecting electrode layer, wherein the reflecting electrode comprises an array of pixel electrodes, each controlling one of pixels in two-dimensional (2D) array, and is built on a silicon substrate.

2. The spatial light modulator as recited in claim 1, wherein the two different geometries include short-pitch grating and large-pitch grating and each of the pixels corresponds to either one of the short-pitch grating and the large-pitch grating.

3. The spatial light modulator as recited in claim 2, wherein the short-pitch grating and the large-pitch grating alternate across the first layer of optical grating.

4. The spatial light modulator as recited in claim 3, wherein amplitude and phase modulations alternate across the 2D array.

5. The spatial light modulator as recited in claim 1, wherein each of the pixels corresponds to both of the short-pitch grating and the large-pitch grating.

6. The spatial light modulator as recited in claim 5, wherein amplitude and phase modulations take place within a single pixel.

7. The spatial light modulator as recited in claim 1, wherein the first layer of grating is created using an operation including:
   providing a layer of monomer liquid on a transparent substrate;
   pressing a stamper onto the monomer liquid to create imprints in the monomer liquid;
   curing the monomer liquid to create the first layer of grating with the short-pitch grating and the large-pitch grating.

8. The spatial light modulator as recited in claim 7, wherein the stamper is made from polydimethylsiloxane (PDMS).

9. The spatial light modulator as recited in claim 7, wherein the stamper is patterned against a master to form a relief pattern.

10. The spatial light modulator as recited in claim 1, wherein the first layer of grating is created using an operation including:
    providing a layer of monomer liquid on a transparent substrate;
    pressing a stamper onto the monomer liquid to create imprints in the monomer liquid, wherein the stamper is patterned against a master to form a relief pattern;
    curing the monomer liquid to create an opposite image of the relief pattern in the stamper.

11. The spatial light modulator as recited in claim 1, further comprising:
    a second layer of grating, wherein the layer of liquid crystals is sandwiched between the first layer of grating and the second layer of grating.

12. The spatial light modulator as recited in claim 11, wherein the second layer of grating includes a shallow or short-pitch grating for liquid crystal alignment superimposed onto a deeper or large-pitch grating so as to cause light modulations in amplitude and phase.

\* \* \* \* \*